US012750263B2

(12) United States Patent
Wu et al.

(10) Patent No.: US 12,750,263 B2
(45) Date of Patent: Sep. 29, 2026

(54) EFFICIENT ARITHMETIC CODING FOR MULTIPLE COMPOSITION DISTRIBUTION MATCHER (MCDM)

(71) Applicant: QUALCOMM Incorporated, San Diego, CA (US)

(72) Inventors: Liangming Wu, Beijing (CN); Kexin Xiao, Shanghai (CN); Thomas Joseph Richardson, South Orange, NJ (US); Changlong Xu, Beijing (CN); Ori Shental, Marlboro, NJ (US); Kangqi Liu, San Diego, CA (US); Wei Liu, Beijing (CN); Hao Xu, Beijing (CN)

(73) Assignee: QUALCOMM Incorproated, San Diego, CA (US)

(*) Notice: Subject to any disclaimer, the term of this patent is extended or adjusted under 35 U.S.C. 154(b) by 316 days.

(21) Appl. No.: 18/546,705

(22) PCT Filed: Apr. 27, 2021

(86) PCT No.: PCT/CN2021/090115

§ 371 (c)(1),
(2) Date: Aug. 16, 2023

(87) PCT Pub. No.: WO2022/226755

PCT Pub. Date: Nov. 3, 2022

(65) Prior Publication Data

US 2024/0137253 A1 Apr. 25, 2024

(51) Int. Cl.
*H04L 27/00* (2006.01)
*H03M 7/40* (2006.01)

(52) U.S. Cl.
CPC ...... *H04L 27/0012* (2013.01); *H03M 7/4006* (2013.01)

(58) Field of Classification Search
CPC ......................... H04L 27/0012; H03M 7/4006
See application file for complete search history.

(56) References Cited

U.S. PATENT DOCUMENTS

2019/0149388 A1 5/2019 Torbatian

FOREIGN PATENT DOCUMENTS

WO 2020083491 A1 4/2020

OTHER PUBLICATIONS

Cho J., et al., "Probabilistic Constellation Shaping for Optical Fiber Communications", Journal of Lightwave Technology, IEEE, USA, vol. 37, No. 6, Mar. 15, 2019 (Mar. 15, 2019), pp. 1590-1607, XP011717096, ISSN: 0733-8724, DOI: 10.1109/JLT.2019.2898855, [retrieved on Mar. 29, 2019] p. 1601, abstract, Section 1, 2, 3.

(Continued)

*Primary Examiner* — Ronald B Abelson
(74) *Attorney, Agent, or Firm* — Harrity & Harrity, LLP

(57) ABSTRACT

Wireless communications systems and methods related to an efficient arithmetic coding based multiple composition distribution matcher (MCDM) are provided. A wireless communication device selects, based on a first value representing a sequence of bits, a first composition from a plurality of compositions. Each composition of the plurality of compositions includes a different modulation symbol distribution associated with a modulation scheme. The wireless communication device encodes, based on the first composition, the sequence of bits into a sequence of symbols using arithmetic coding. The wireless communication device transmits a communication signal including the sequence of symbols.

26 Claims, 13 Drawing Sheets

(56) References Cited

OTHER PUBLICATIONS

Huawei, et al., "Signal shaping for QAM Constellations", 3GPP TSG RAN WG1 Meeting# 88bis, R1-1705061, 3rd Generation Partnership Project, Mobile Competence Centre, 650, Route Des Lucioles, F-06921 Sophia-Antipolis Cedex, France vol. RAN WG1, No. Spokane, USA, Apr. 3, 2017-Apr. 7, 2017, Apr. 2, 2017, XP051243192, 11 Pages, Section 2.2, Introduction, p. 1, Section 2.1, p. 2.

International Search Report and Written Opinion—PCT/CN2021/090115—ISA/EPO—Oct. 22, 2021.

Huawei, et al., "Signal shaping for QAM Constellations", 3GPP TSG RAN WG1 Meeting# 88bis, R1-1705061, 3rd Generation Partnership Project, Mobile Competence Centre, 650, Route Des Lucioles, F-06921 Sophia-Antipolis Cedex, France vol. RAN WG1, No. Spokane, USA, Apr. 3, 2017-Apr. 7, 2017, Apr. 2, 2017, XP051243192, 11 Pages.

510

514

512 516 518

| Cmp-idx | Qa(1) | Qa(2) | Qa(3) | Qa(4) | # hypo | mean symbol power | |
|---|---|---|---|---|---|---|---|
| 1 | 1 | 1 | 1 | 1 | 1 | 1 | 520 |
| 2 | 1 | 1 | 1 | 3 | 4 | 3 | 522 |
| | 1 | 1 | 3 | 1 | | | |
| | 1 | 3 | 1 | 1 | | | |
| | 3 | 1 | 1 | 1 | | | |
| 3 | 1 | 1 | 3 | 3 | 6 | 5 | 524 |
| | 1 | 3 | 1 | 3 | | | |
| | 1 | 3 | 3 | 1 | | | |
| | 3 | 1 | 1 | 3 | | | |
| | 3 | 1 | 3 | 1 | | | |
| | 3 | 3 | 1 | 1 | | | |
| 4 | 1 | 3 | 3 | 3 | 4 | 7 | 526 |
| | 3 | 1 | 3 | 3 | | | |
| | 3 | 3 | 1 | 3 | | | |
| | 3 | 3 | 3 | 1 | | | |
| 5 | 3 | 3 | 3 | 3 | 1 | 9 | 528 |

EFFICIENT ARITHMETIC CODING FOR MULTIPLE COMPOSITION DISTRIBUTION MATCHER (MCDM)

CROSS-REFERENCE TO RELATED APPLICATIONS

The present application is a 35 U.S.C. 371 National Phase entry of Patent Cooperation Treaty (PCT) Application No. PCT/CN2021/090115, filed Apr. 27, 2021, which is hereby incorporated by reference in its entirety as if fully set forth below and for all applicable purposes.

TECHNICAL FIELD

This application relates to wireless communication systems, and more particularly to providing an efficient arithmetic coding based multiple composition distribution matcher (MCDM), for example, for constellation shaping.

INTRODUCTION

Wireless communications systems are widely deployed to provide various types of communication content such as voice, video, packet data, messaging, broadcast, and so on. These systems may be capable of supporting communication with multiple users by sharing the available system resources (e.g., time, frequency, and power). A wireless multiple-access communications system may include a number of base stations (BSs), each simultaneously supporting communications for multiple communication devices, which may be otherwise known as user equipment (UE).

To meet the growing demands for expanded mobile broadband connectivity, wireless communication technologies are advancing from the long term evolution (LTE) technology to a next generation new radio (NR) technology, which may be referred to as 5$^{th}$ Generation (5G). For example, NR is designed to provide a lower latency, a higher bandwidth or a higher throughput, and a higher reliability than LTE. NR is designed to operate over a wide array of spectrum bands, for example, from low-frequency bands below about 1 gigahertz (GHz) and mid-frequency bands from about 1 GHz to about 6 GHz, to high-frequency bands such as millimeter wave (mmWave) bands. NR is also designed to operate across different spectrum types, from licensed spectrum to unlicensed and shared spectrum. Spectrum sharing enables operators to opportunistically aggregate spectrums to dynamically support high-bandwidth services. Spectrum sharing can extend the benefit of NR technologies to operating entities that may not have access to a licensed spectrum. As use cases and diverse deployment scenarios continue to expand in wireless communication, modulation and/or coding technique improvements may also yield benefits.

BRIEF SUMMARY OF SOME EXAMPLES

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

In one aspect of the disclosure, a method of wireless communication performed by a wireless communication device includes selecting, based on a first value representing a sequence of bits, a first composition from a plurality of compositions, where each composition of the plurality of compositions includes a different modulation symbol distribution associated with a modulation scheme; encoding, based on the first composition, the sequence of bits into a sequence of symbols using arithmetic coding; and transmitting a communication signal including the sequence of symbols.

In an additional aspect of the disclosure, a method of wireless communication performed by a wireless communication device includes selecting, based on a sequence of symbols associated with a modulation scheme, a first composition from a plurality of compositions, where each composition of the plurality of compositions includes a different modulation symbol distribution associated with the modulation scheme; and decoding, based on the first composition, the sequence of symbols using arithmetic coding to obtain a sequence of bits.

In an additional aspect of the disclosure, a wireless communication device includes a memory; a transceiver; and at least one processor operatively coupled to the memory and the transceiver, where the at least one processor is configured to select, based on a first value representing a sequence of bits, a first composition from a plurality of compositions, where each composition of the plurality of compositions includes a different modulation symbol distribution associated with a modulation scheme; encode, based on the first composition, the sequence of bits into a sequence of symbols using arithmetic coding; and transmit, via the transceiver, a communication signal including the sequence of symbols.

In an additional aspect of the disclosure, a wireless communication device includes a memory; and at least one processor operatively coupled to the memory, where the at least one processor is configured to select, based on a sequence of symbols associated with a modulation scheme, a first composition from a plurality of compositions, where each composition of the plurality of compositions includes a different modulation symbol distribution associated with the modulation scheme; and decode, based on the first composition, the sequence of symbols using arithmetic coding to obtain a sequence of bits.

Other aspects and features of the present invention will become apparent to those of ordinary skill in the art, upon reviewing the following description of specific, exemplary aspects of the present invention in conjunction with the accompanying figures. While features of the present invention may be discussed relative to certain aspects and figures below, all aspects of the present invention can include one or more of the advantageous features discussed herein. In other words, while one or more aspects may be discussed as having certain advantageous features, one or more of such features may also be used in accordance with the various aspects of the invention discussed herein. In similar fashion, while exemplary aspects may be discussed below as device, system, or method aspects it should be understood that such exemplary aspects can be implemented in various devices, systems, and methods.

DETAILED DESCRIPTION

Figure 1:
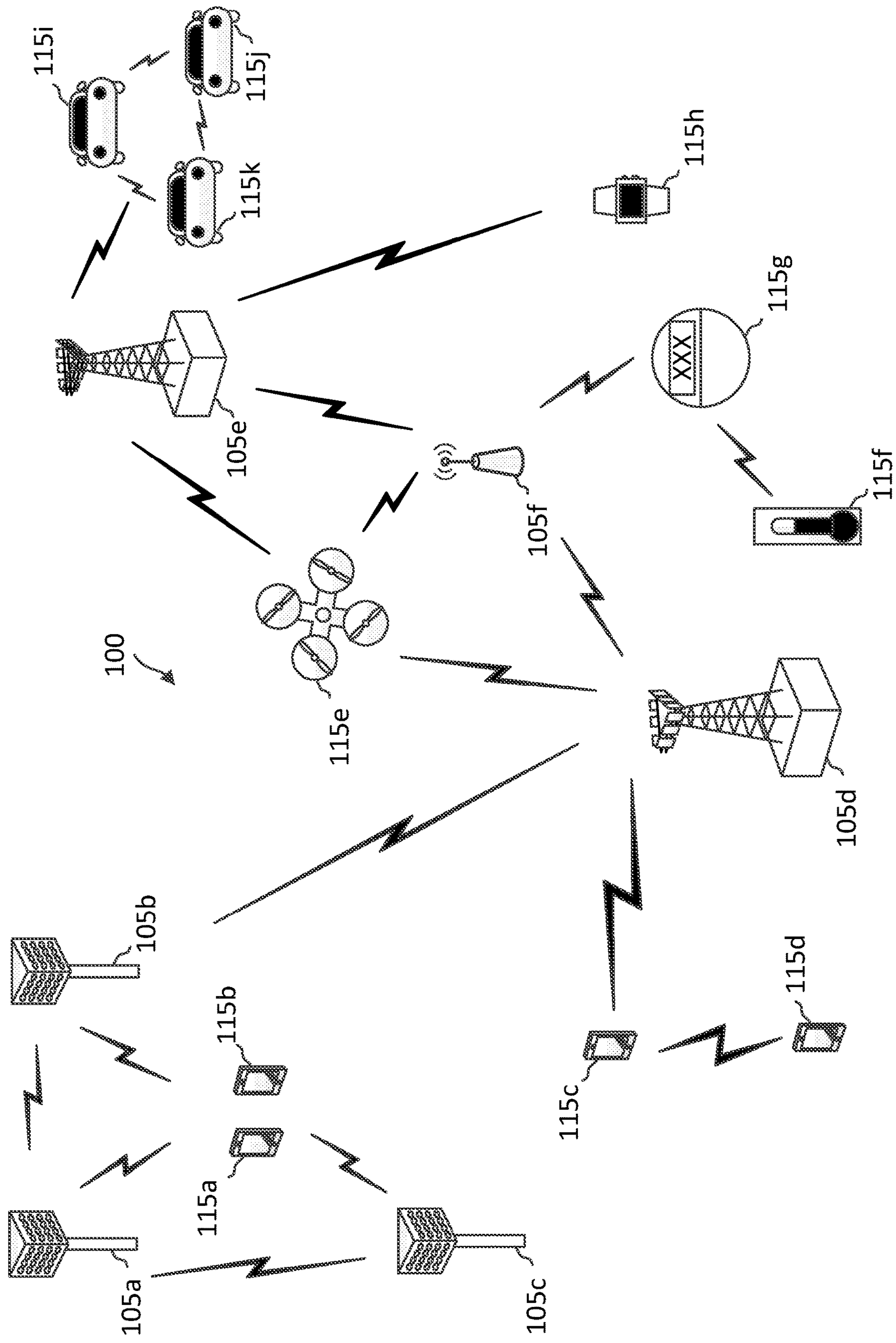
FIG. 1 illustrates a wireless communication network according to some aspects of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some aspects, well-known structures and components are shown in block diagram form in order to avoid obscuring such concepts.

This disclosure relates generally to wireless communications systems, also referred to as wireless communications networks. In various aspects, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, LTE networks, Global System for Mobile Communications (GSM) networks, $5^{th}$ Generation (5G) or new radio (NR) networks, as well as other communications networks. As described herein, the terms "networks" and "systems" may be used interchangeably.

An OFDMA network may implement a radio technology such as evolved UTRA (E-UTRA), Institute of Electrical and Electronics Engineers (IEEE) 802.11, IEEE 802.16, IEEE 802.20, flash-OFDM and the like. UTRA, E-UTRA, and GSM are part of universal mobile telecommunication system (UMTS). In particular, long term evolution (LTE) is a release of UMTS that uses E-UTRA. UTRA, E-UTRA, GSM, UMTS and LTE are described in documents provided from an organization named "3rd Generation Partnership Project" (3GPP), and cdma2000 is described in documents from an organization named "3rd Generation Partnership Project 2" (3GPP2). These various radio technologies and standards are known or are being developed. For example, the 3rd Generation Partnership Project (3GPP) is a collaboration between groups of telecommunications associations that aims to define a globally applicable third generation (3G) mobile phone specification. 3GPP long term evolution (LTE) is a 3GPP project which was aimed at improving the UMTS mobile phone standard. The 3GPP may define specifications for the next generation of mobile networks, mobile systems, and mobile devices. The present disclosure is concerned with the evolution of wireless technologies from LTE, 4G, 5G, NR, and beyond with shared access to wireless spectrum between networks using a collection of new and different radio access technologies or radio air interfaces.

In particular, 5G networks contemplate diverse deployments, diverse spectrum, and diverse services and devices that may be implemented using an OFDM-based unified, air interface. In order to achieve these goals, further enhancements to LTE and LTE-A are considered in addition to development of the new radio technology for 5G NR networks. The 5G NR will be capable of scaling to provide coverage (1) to a massive Internet of things (IoTs) with a ULtra-high density (e.g., ~1 M nodes/km$^2$), ultra-low complexity (e.g., ~10 s of bits/sec), ultra-low energy (e.g., ~10+ years of battery life), and deep coverage with the capability to reach challenging locations; (2) including mission-critical control with strong security to safeguard sensitive personal, financial, or classified information, ultra-high reliability (e.g., ~99.9999% reliability), ultra-low latency (e.g., ~1 ms), and users with wide ranges of mobility or lack thereof; and (3) with enhanced mobile broadband including extreme high capacity (e.g., ~10 Tbps/km$^2$), extreme data rates (e.g., multi-Gbps rate, 100+ Mbps user experienced rates), and deep awareness with advanced discovery and optimizations.

The 5G NR may be implemented to use optimized OFDM-based waveforms with scalable numerology and transmission time interval (TTI); having a common, flexible framework to efficiently multiplex services and features with a dynamic, low-latency time division duplex (TDD)/frequency division duplex (FDD) design; and with advanced wireless technologies, such as massive multiple input, multiple output (MIMO), robust millimeter wave (mmWave) transmissions, advanced channel coding, and device-centric mobility. Scalability of the numerology in 5G NR, with scaling of subcarrier spacing, may efficiently address operating diverse services across diverse spectrum and diverse deployments. For example, in various outdoor and macro coverage deployments of less than 3 GHz FDD/TDD implementations, subcarrier spacing may occur with 15 kHz, for example over 5, 10, 20 MHz, and the like bandwidth (BW). For other various outdoor and small cell coverage deployments of TDD greater than 3 GHz, subcarrier spacing may occur with 30 kHz over 80/100 MHz BW. For other various indoor wideband implementations, using a TDD over the unlicensed portion of the 5 GHz band, the subcarrier spacing may occur with 60 kHz over a 160 MHz BW. Finally, for various deployments transmitting with mmWave components at a TDD of 28 GHz, subcarrier spacing may occur with 120 kHz over a 500 MHz BW.

The scalable numerology of the 5G NR facilitates scalable TTI for diverse latency and quality of service (QoS) requirements. For example, shorter TTI may be used for low latency and high reliability, while longer TTI may be used for higher spectral efficiency. The efficient multiplexing of long and short TTIs to allow transmissions to start on symbol boundaries. 5G NR also contemplates a self-contained integrated subframe design with UL/downlink scheduling information, data, and acknowledgement in the same subframe. The self-contained integrated subframe supports communications in unlicensed or contention-based shared spectrum, adaptive UL/downlink that may be flexibly configured on a per-cell basis to dynamically switch between UL and downlink to meet the current traffic needs.

Various other aspects and features of the disclosure are further described below. It should be apparent that the teachings herein may be embodied in a wide variety of forms and that any specific structure, function, or both being disclosed herein is merely representative and not limiting. Based on the teachings herein one of an ordinary level of skill in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. For example, a method may be implemented as part of a system, device, apparatus, and/or as instructions stored on a computer readable medium for execution on a processor or computer. Furthermore, an aspect may comprise at least one element of a claim.

In a wireless communication network, a transmitter may encode information data according to a certain error correction coding scheme to improve communication reliability. The transmitter may modulate the encoded information onto frequency subcarriers according to a certain modulation scheme for transmission. The transmitter may utilize a wide variety of modulation techniques. In some aspects, the transmitter may utilize quadrature-amplitude-modulation (QAM)-based modulation techniques. A channel capacity generally refers to a maximum transmission rate for a given channel based on a bandwidth and a signal-to-noise ratio (SNR) supported by the channel. This channel capacity may be generally referred to as the "Shannon capacity." A QAM-based transmission with uniformly distributed QAM symbols may not be capable of reaching the Shannon's capacity. For instance, uniform QAM may be about 1.53 decibel (dB) away from a capacity-to-signal-to-noise-ratio (SNR) curve asymptotically.

A modulation scheme may have a certain constellation with constellation points in a complex plane. The constellation points may also be referred to as constellation symbols or modulation symbols. A transmission generated using a certain modulation scheme may carry information data bits represented by constellation symbols from a set of constellation symbols defined for the modulation scheme. In certain aspects, constellation shaping can be applied to provide non-uniformly distributed constellation symbols so that a channel capacity can be improved. That is, a transmission may be generated such that different constellation symbols in the set of constellation symbols for a certain modulation scheme may have different number of occurrences in the transmission.

A constellation with a Gaussian distribution may provide a good performance (e.g., with a data rate close to the Shannon's capacity). Some example for providing non-uniform distribution of constellation utilizing QAM may include geometric constellation shaping and/or probabilistic constellation shaping. With geometric constellation shaping, each constellation point in the complex plane is generally utilized with an equal probability, but the location of the constellation points in the complex plane is altered from the uniform grid to exhibit a generally Gaussian amplitude distribution. With probabilistic constellation shaping, which may also be referred to as probabilistic amplitude shaping (PAS), a more conventional (e.g., grid-like) uniform distribution of symbols is used in the complex plane, but with a non-equal probability of use of the respective constellation symbols.

In certain aspects, a distribution matcher (DM) may be applied to transform a sequence of k uniformly distributed bits (e.g., information bits) into a sequence of n symbols (codewords) with a desired or target probability distribution. An example of a DM may be a constant composition distribution matcher (CCDM). One characteristic of a CCDM is that all symbol sequences output by the CCDM have an identical composition (a single composition). A composition is a set of ordered occurrences for each symbol in a set of M symbols, where symbols in the symbol sequence output by the DM are from the set of M symbols. When a DM is applied for constellation shaping, the set of M symbols may be based on a modulation scheme. For example, the set of M modulation symbols or modulation symbol alphabet for 16-QAM is $\{\pm1, \pm3\}$. As another example, the set of M modulation symbols or modulation symbol alphabet for 64-QAM is $\{\pm1, \pm3, \pm5, \pm7\}$. Accordingly, in the context of constellation shaping, a composition may also be referred to as a modulation symbol distribution, which may include a number of occurrences for each symbol in a set of M symbols associated with a modulation scheme. While CCDM may provide a non-uniformly distributed or shaped constellation, CCDM may not perform well for short-length packets due to use of a single composition. Thus, rate-loss may be high for short-length packet transmissions using CCDM.

The present disclosure describes mechanisms for performing efficient arithmetic coding-based multiple composition distribution matcher (MCDM) encoding and/or decoding, for example, for constellation shaping. In some aspects, a wireless communication device, which may be a BS or a UE, may utilize MCDM encoding to map a sequence of k number of information or message data bits to a sequence of n number of non-uniformly distributed symbols having a desired target probability of distribution for transmission. In some instances, the sequence of k number of information or message data bits may have a more or less uniform distribution. To perform the MCDM encode, the wireless communication device may select a first composition from a plurality of compositions based on a first value representing the sequence of bits. In some aspects, the wireless communication device may compute the first value by converting the sequence of binary bits to a decimal value (greater than or equal to 0 and less than 1), which may be referred to as dyadic point.

Each composition of the plurality of compositions may have a different modulation symbol distribution. For example, the wireless communication device may determine the plurality of compositions by determining all the possible combinations of modulation symbols (from a set of M number of modulation symbols for a modulation scheme) that may be used to represent k binary bits and grouping combination(s) that have the same number of occurrences for each symbol of the set of M modulation symbols into a composition. Because DM considers and operates on the positive amplitude components of the modulation symbol, the wireless communication device may disregard or drop the sign information of the modulation symbol amplitudes when determining the plurality of compositions. In some aspects, the wireless communication device may select a subset of compositions from the plurality of compositions, for example, based on certain rule(s), parameter(s), and/or desired transmission signal characteristic(s), such as a mean symbol power or any other suitable signal characteristic. Each subset of compositions may be associated with a certain probability of occurrences where the probabilities of occurrences for all compositions in the subset may add up to 1. Accordingly, the probabilities of occurrences for all compositions in the subset may be presented by an interval between 0.0 (a second value) and 1.0 (a third value). The interval may be partitioned into a plurality of sub-intervals each corresponding to one composition of the subset of compositions. The plurality of sub-intervals are non-overlapping and adjacent to each other within the interval.

In some aspects, as part of selecting the first composition, the wireless communication device may select the first composition from the subset of compositions. In this regard, the wireless communication device may select the first composition based on the first value being located within a first sub-interval of the plurality of sub-intervals, where the first sub-interval corresponds to the first composition. The first sub-interval may be between a fourth value and a fifth value. In some instances, the fourth value may be an inclusive lower border value or limit of the first sub-interval, and the fifth value may be an exclusive upper border value or limit of the first sub-interval. After selecting the first composition, the wireless communication device may encode the sequence of bits into the sequence of symbols using arithmetic coding. Typically, arithmetic encoding is used for converting symbols to bits, while arithmetic decoding is used for converting bits to symbols. Accordingly, the wireless communication device may apply arithmetic decoding techniques to encode the sequence of bits into the sequence of symbols. The wireless communication device may perform the encoding based on the first sub-interval between the fourth value and the fifth value. That is, the wireless communication device may begin the arithmetic coding with an initial interval between the fourth value and the fifth value instead of between 0 and 1 that are commonly used for arithmetic coding. Subsequently, the first wireless communication device may transmit a communication signal including the sequence of symbols over a channel to a receiver.

In some aspects, it may be desirable to implement arithmetic coding using integer or fixed-point implementation with a finite-precision, for example, to reduce the device cost. For finite-precision arithmetic coding, the wireless communication device may scale the fourth and fifth values associated with the first composition. In this regard, the wireless communication device may apply a scaling factor to the fourth value (e.g., the lower limit of the first sub-interval associated with the first composition) to obtain a sixth value and apply the scaling factor to the fifth value (e.g., the upper limit of the first sub-interval) to obtain a seventh value. In some aspects, the scaling factor can be computed based on the modulation symbol distribution of the first composition and/or a number of bits in the sequence of bits. Further, the wireless communication device may apply the scaling factor to the sequence of bits. After the scaling, the wireless communication device may perform the encoding on the scaled sequence of bits based on an interval between the sixth value and the seventh value. Further, in some aspects, the wireless communication device may select the first composition by observing a portion of the sequence of bits. For instance, the wireless communication device may read or obtain (e.g., from a medium access control (MAC) layer of the wireless communication device) a beginning portion of the sequence of bits and may select the first composition based on the beginning portion of the sequence of bits before the entire sequence is read or obtained, for example, to reduce processing latency.

In some aspects, the wireless communication device may receive a communication signal carrying a sequence of n symbols representing a sequence of k bits over a channel. For instance, a transmitter of the communication signal may generate the sequence of symbols using MCDM encoding, for example, as discussed above. The wireless communication device may perform MCDM decoding on the communication signal to recover the sequence of bits. The MCDM decoding may be substantially similar to the MCDM encoding. For instance, the MCDM decoding may include composition selection, interval scaling, and arithmetic coding. As explained above, arithmetic encoding is used for converting symbols to bits. Accordingly, the wireless communication device may apply arithmetic encoding techniques to obtain the sequence of bits from the sequence of symbols after the composition selection. In that regard, the wireless communication device may select a first composition from a plurality of compositions based on a sequence of symbols associated with a modulation scheme. As similarly discussed above, each composition of the plurality of compositions may have a different modulation symbol distribution. The wireless communication device may determine the plurality of compositions and select a subset of compositions from the plurality of compositions using similar mechanisms as in the MCDM encoding process discussed above.

As part of selecting the first composition for the MCDM decoding, the wireless communication device may select the first composition from the subset of composition based on the sequence of symbols. In this regard, the wireless communication device may compare a modulation symbol distribution of the received sequence of symbols to the modulation symbol distribution of each composition in the subset of compositions. For instance, the wireless communication device may count the number of occurrences for each symbol of a set of M symbols in the sequence of symbols to obtain the modulation symbol distribution for the received sequence of symbols. The wireless communication device may select the first composition based on the modulation symbol distribution of the received sequence of symbols matching the modulation symbol distribution of the first composition. That is, the selection of the first composition is based on the modulation symbol distribution of the received sequence of symbols being the same as the modulation distribution of the first composition. Further, as similarly discussed above, each composition in the subset of compositions may correspond to one sub-interval of a plurality of sub-intervals within an interval between 0 and 1. The wireless communication device may select a first sub-interval of the plurality of sub-intervals that correspond to the first composition. The wireless communication device may decode the sequence of bits from the sequence of symbols based on the first composition using arithmetic coding (e.g., based on arithmetic encoding techniques). In this regard, the wireless communication device may perform the decoding based on the first sub-interval. That is, the wireless communication device may begin the arithmetic coding (arithmetic encoding) with an initial interval corresponding to the selected first sub-interval. In some instances, the wireless communication device may also utilize integer or fixed-point implementation to implement the arithmetic coding (arithmetic encoding), for example, to reduce the device cost. In such instances, the wireless communication device may enlarge the initial interval for the arithmetic coding (arithmetic encoding) by scaling the lower border value and the upper border value of first sub-interval. In some aspects, the scaling can be based on the modulation symbol distribution of the first composition and/or the number of symbols in the sequence of symbols.

Aspects of the present disclosure can provide several benefits. For example, utilizing multiple compositions for distribution matching instead of a single composition as in CCDM, the rate loss performance can be significantly improved. Additionally, utilizing arithmetic coding for MCDM encoding can provide an efficient implementation. Further, implementing the MCDM encoding/decoding using integer or fixed-point implementation with interval scaling can reduce the device cost while providing a sufficient precision for arithmetic encoding/decoding to achieve a good performance.

FIG. 1 illustrates a wireless communication network 100 according to some aspects of the present disclosure. The network 100 may be a 5G network. The network 100 includes a number of base stations (BSs) 105 (individually labeled as 105*a*, 105*b*, 105*c*, 105*d*, 105*e*, and 105*f*) and other network entities. A BS 105 may be a station that communicates with UEs 115 (individually labeled as 115*a*, 115*b*, 115*c*, 115*d*, 115*e*, 115*f*, 115*g*, 115*h*, and 115*k*) and may also be referred to as an evolved node B (eNB), a next generation eNB (gNB), an access point, and the like. Each BS 105 may provide communication coverage for a particular geographic area. In 3GPP, the term “cell” can refer to this particular geographic coverage area of a BS 105 and/or a BS subsystem serving the coverage area, depending on the context in which the term is used.

A BS 105 may provide communication coverage for a macro cell or a small cell, such as a pico cell or a femto cell, and/or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A BS for a macro cell may be referred to as a macro BS. A BS for a small cell may be referred to as a small cell BS, a pico BS, a femto BS or a home BS. In the example shown in FIG. 1, the BSs 105*d* and 105*e* may be regular macro BSs, while the BSs 105*a*-105*c* may be macro BSs enabled with one of three dimension (3D), full dimension (FD), or massive MIMO. The BSs 105*a*-105*c* may take advantage of their higher dimension MIMO capabilities to exploit 3D beamforming in both elevation and azimuth beamforming to increase coverage and capacity. The BS 105*f* may be a small cell BS which may be a home node or portable access point. A BS 105 may support one or multiple (e.g., two, three, four, and the like) cells.

The network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time.

The UEs 115 are dispersed throughout the wireless network 100, and each UE 115 may be stationary or mobile. A UE 115 may also be referred to as a terminal, a mobile station, a subscriber unit, a station, or the like. A UE 115 may be a cellular phone, a personal digital assistant (PDA), a wireless modem, a wireless communication device, a handheld device, a tablet computer, a laptop computer, a cordless phone, a wireless local loop (WLL) station, or the like. In one aspect, a UE 115 may be a device that includes a Universal Integrated Circuit Card (UICC). In another aspect, a UE may be a device that does not include a UICC. In some aspects, the UEs 115 that do not include UICCs may also be referred to as IoT devices or internet of everything (IoE) devices. The UEs 115*a*-115*d* are examples of mobile smart phone-type devices accessing network 100. A UE 115 may also be a machine specifically configured for connected communication, including machine type communication (MTC), enhanced MTC (eMTC), narrowband IoT (NB-IoT) and the like. The UEs 115*e*-115*h* are examples of various machines configured for communication that access the network 100. The UEs 115*i*-115*k* are examples of vehicles equipped with wireless communication devices configured for communication that access the network 100. A UE 115 may be able to communicate with any type of the BSs, whether macro BS, small cell, or the like. In FIG. 1, a lightning bolt (e.g., communication links) indicates wireless transmissions between a UE 115 and a serving BS 105, which is a BS designated to serve the UE 115 on the downlink (DL) and/or uplink (UL), desired transmission between BSs 105, backhaul transmissions between BSs, or sidelink transmissions between UEs 115.

In operation, the BSs 105*a*-105*c* may serve the UEs 115*a* and 115*b* using 3D beamforming and coordinated spatial techniques, such as coordinated multipoint (CoMP) or multi-connectivity. The macro BS 105*d* may perform backhaul communications with the BSs 105*a*-105*c*, as well as small cell, the BS 105*f*. The macro BS 105*d* may also transmits multicast services which are subscribed to and received by the UEs 115*c* and 115*d*. Such multicast services may include mobile television or stream video, or may include other services for providing community information, such as weather emergencies or alerts, such as Amber alerts or gray alerts.

The BSs 105 may also communicate with a core network. The core network may provide user authentication, access authorization, tracking, Internet Protocol (IP) connectivity, and other access, routing, or mobility functions. At least some of the BSs 105 (e.g., which may be an example of a gNB or an access node controller (ANC)) may interface with the core network through backhaul links (e.g., NG-C, NG-U, etc.) and may perform radio configuration and scheduling for communication with the UEs 115. In various examples, the BSs 105 may communicate, either directly or indirectly (e.g., through core network), with each other over backhaul links (e.g., X1, X2, etc.), which may be wired or wireless communication links.

The network 100 may also support mission critical communications with ultra-reliable and redundant links for mission critical devices, such as the UE 115*e*, which may be a drone. Redundant communication links with the UE 115*e* may include links from the macro BSs 105*d* and 105*e*, as well as links from the small cell BS 105*f*. Other machine type devices, such as the UE 115*f* (e.g., a thermometer), the UE 115*g* (e.g., smart meter), and UE 115*h* (e.g., wearable device) may communicate through the network 100 either directly with BSs, such as the small cell BS 105*f*, and the macro BS 105*e*, or in multi-action-size configurations by communicating with another user device which relays its information to the network, such as the UE 115*f* communicating temperature measurement information to the smart meter, the UE 115*g*, which is then reported to the network through the small cell BS 105*f*. The network 100 may also provide additional network efficiency through dynamic, low-latency TDD/FDD communications, such as V2V, V2X, C-V2X communications between a UE 115*i*, 115*j*, or 115*k* and other UEs 115, and/or vehicle-to-infrastructure (V2I) communications between a UE 115*i*, 115*j*, or 115*k* and a BS 105.

In some implementations, the network 100 utilizes OFDM-based waveforms for communications. An OFDM-based system may partition the system BW into multiple (K) orthogonal subcarriers, which are also commonly referred to as subcarriers, tones, bins, or the like. Each subcarrier may be modulated with data. In some aspects, the subcarrier spacing between adjacent subcarriers may be fixed, and the total number of subcarriers (K) may be dependent on the system BW. The system BW may also be partitioned into subbands. In other aspects, the subcarrier spacing and/or the duration of TTIs may be scalable.

In some aspects, the BSs 105 can assign or schedule transmission resources (e.g., in the form of time-frequency resource blocks (RB)) for downlink (DL) and uplink (UL) transmissions in the network 100. DL refers to the transmission direction from a BS 105 to a UE 115, whereas UL refers to the transmission direction from a UE 115 to a BS 105. The communication can be in the form of radio frames. A radio frame may be divided into a plurality of subframes or slots, for example, about 10. Each slot may be further divided into mini-slots. In a FDD mode, simultaneous UL and DL transmissions may occur in different frequency bands. For example, each subframe includes a UL subframe in a UL frequency band and a DL subframe in a DL frequency band. In a TDD mode, UL and DL transmissions occur at different time periods using the same frequency band. For example, a subset of the subframes (e.g., DL subframes) in a radio frame may be used for DL transmissions and another subset of the subframes (e.g., UL subframes) in the radio frame may be used for UL transmissions.

The DL subframes and the UL subframes can be further divided into several regions. For example, each DL or UL subframe may have pre-defined regions for transmissions of reference signals, control information, and data. Reference signals are predetermined signals that facilitate the communications between the BSs 105 and the UEs 115. For example, a reference signal can have a particular pilot pattern or structure, where pilot tones may span across an operational BW or frequency band, each positioned at a pre-defined time and a pre-defined frequency. For example, a BS 105 may transmit cell specific reference signals (CRSs) and/or channel state information-reference signals (CSI-RSs) to enable a UE 115 to estimate a DL channel. Similarly, a UE 115 may transmit sounding reference signals (SRSs) to enable a BS 105 to estimate a UL channel. Control information may include resource assignments and protocol controls. Data may include protocol data and/or operational data. In some aspects, the BSs 105 and the UEs 115 may communicate using self-contained subframes. A self-contained subframe may include a portion for DL communication and a portion for UL communication. A self-contained subframe can be DL-centric or UL-centric. A DL-centric subframe may include a longer duration for DL communication than for UL communication. A UL-centric subframe may include a longer duration for UL communication than for UL communication.

In some aspects, the network 100 may be an NR network deployed over a licensed spectrum. The BSs 105 can transmit synchronization signals (e.g., including a primary synchronization signal (PSS) and a secondary synchronization signal (SSS)) in the network 100 to facilitate synchronization. The BSs 105 can broadcast system information associated with the network 100 (e.g., including a master information block (MIB), remaining system information (RMSI), and other system information (OSI)) to facilitate initial network access. In some aspects, the BSs 105 may broadcast the PSS, the SSS, and/or the MIB in the form of synchronization signal block (SSBs) and may broadcast the RMSI and/or the OSI over a physical downlink shared channel (PDSCH). The MIB may be transmitted over a physical broadcast channel (PBCH).

In some aspects, a UE 115 attempting to access the network 100 may perform an initial cell search by detecting a PSS from a BS 105. The PSS may enable synchronization of period timing and may indicate a physical layer identity value. The UE 115 may then receive a SSS. The SSS may enable radio frame synchronization, and may provide a cell identity value, which may be combined with the physical layer identity value to identify the cell. The PSS and the SSS may be located in a central portion of a carrier or any suitable frequencies within the carrier.

After receiving the PSS and SSS, the UE 115 may receive a MIB. The MIB may include system information for initial network access and scheduling information for RMSI and/or OSI. After decoding the MIB, the UE 115 may receive RMSI and/or OSI. The RMSI and/or OSI may include radio resource control (RRC) information related to random access channel (RACH) procedures, paging, control resource set (CORESET) for physical downlink control channel (PDCCH) monitoring, physical UL control channel (PUCCH), physical UL shared channel (PUSCH), power control, and SRS.

After obtaining the MIB, the RMSI and/or the OSI, the UE 115 can perform a random access procedure to establish a connection with the BS 105. In some examples, the random access procedure may be a four-step random access procedure. For example, the UE 115 may transmit a random access preamble and the BS 105 may respond with a random access response. The random access response (RAR) may include a detected random access preamble identifier (ID) corresponding to the random access preamble, timing advance (TA) information, a UL grant, a temporary cell-radio network temporary identifier (C-RNTI), and/or a back-off indicator. Upon receiving the random access response, the UE 115 may transmit a connection request to the BS 105 and the BS 105 may respond with a connection response. The connection response may indicate a contention resolution. In some examples, the random access preamble, the RAR, the connection request, and the connection response can be referred to as message 1 (MSG1), message 2 (MSG2), message 3 (MSG3), and message 4 (MSG4), respectively. In some examples, the random access procedure may be a two-step random access procedure, where the UE 115 may transmit a random access preamble and a connection request in a single transmission and the BS 105 may respond by transmitting a random access response and a connection response in a single transmission.

After establishing a connection, the UE 115 and the BS 105 can enter a normal operation stage, where operational data may be exchanged. For example, the BS 105 may schedule the UE 115 for UL and/or DL communications. The BS 105 may transmit UL and/or DL scheduling grants to the UE 115 via a PDCCH. The scheduling grants may be transmitted in the form of DL control information (DCI). The BS 105 may transmit a DL communication signal (e.g., carrying data) to the UE 115 via a PDSCH according to a DL scheduling grant. The UE 115 may transmit a UL communication signal to the BS 105 via a PUSCH and/or PUCCH according to a UL scheduling grant. The connection may be referred to as an RRC connection. When the UE 115 is actively exchanging data with the BS 105, the UE 115 is in an RRC connected state.

In an example, after establishing a connection with the BS 105, the UE 115 may initiate an initial network attachment procedure with the network 100. The BS 105 may coordinate with various network entities or fifth generation core (5GC) entities, such as an access and mobility function (AMF), a serving gateway (SGW), and/or a packet data network gateway (PGW), to complete the network attachment procedure. For example, the BS 105 may coordinate with the network entities in the 5GC to identify the UE, authenticate the UE, and/or authorize the UE for sending and/or receiving data in the network 100. In addition, the AMF may assign the UE with a group of tracking areas (TAs). Once the network attach procedure succeeds, a context is established for the UE 115 in the AMF. After a successful attach to the network, the UE 115 can move around the current TA. For tracking area update (TAU), the BS 105 may request the UE 115 to update the network 100 with the UE 115's location periodically. Alternatively, the UE 115 may only report the UE 115's location to the network 100 when entering a new TA. The TAU allows the network 100 to quickly locate the UE 115 and page the UE 115 upon receiving an incoming data packet or call for the UE 115.

In some aspects, the BS 105 may communicate with a UE 115 using hybrid automatic repeat request (HARQ) techniques to improve communication reliability, for example, to provide a URLLC service. The BS 105 may schedule a UE 115 for a PDSCH communication by transmitting a DL grant in a PDCCH. The BS 105 may transmit a DL data packet to the UE 115 according to the schedule in the PDSCH. The DL data packet may be transmitted in the form of a transport block (TB). If the UE 115 receives the DL data packet successfully, the UE 115 may transmit a HARQ acknowledgement (ACK) to the BS 105. Conversely, if the UE 115 fails to receive the DL transmission successfully, the UE 115 may transmit a HARQ NACK to the BS 105. Upon receiving a HARQ negative-acknowledgement (NACK) from the UE 115, the BS 105 may retransmit the DL data packet to the UE 115. The retransmission may include the same coded version of DL data as the initial transmission. Alternatively, the retransmission may include a different coded version of the DL data than the initial transmission. The UE 115 may apply soft combining to combine the encoded data received from the initial transmission and the retransmission for decoding. The BS 105 and the UE 115 may also apply HARQ for UL communications using substantially similar mechanisms as the DL HARQ.

In some aspects, the network 100 may operate over a system BW or a component carrier (CC) BW. The network 100 may partition the system BW into multiple BWPs (e.g., portions). A BS 105 may dynamically assign a UE 115 to operate over a certain BWP (e.g., a certain portion of the system BW). The assigned BWP may be referred to as the active BWP. The UE 115 may monitor the active BWP for signaling information from the BS 105. The BS 105 may schedule the UE 115 for UL or DL communications in the active BWP. In some aspects, a BS 105 may assign a pair of BWPs within the CC to a UE 115 for UL and DL communications. For example, the BWP pair may include one BWP for UL communications and one BWP for DL communications.

In some aspects, the network 100 may operate over a shared channel, which may include shared frequency bands and/or unlicensed frequency bands. For example, the network 100 may be an NR-U network operating over an unlicensed frequency band. In such an aspect, the BSs 105 and the UEs 115 may be operated by multiple network operating entities. To avoid collisions, the BSs 105 and the UEs 115 may employ a listen-before-talk (LBT) procedure to monitor for transmission opportunities (TXOPs) in the shared channel. A TXOP may also be referred to as channel occupancy time (COT). For example, a transmitting node (e.g., a BS 105 or a UE 115) may perform an LBT prior to transmitting in the channel. When the LBT passes, the transmitting node may proceed with the transmission. When the LBT fails, the transmitting node may refrain from transmitting in the channel.

An LBT can be based on energy detection (ED) or signal detection. For an energy detection-based LBT, the LBT results in a pass when signal energy measured from the channel is below a threshold. Conversely, the LBT results in a failure when signal energy measured from the channel exceeds the threshold. An LBT may include one, two, or more clear channel assessments (CCAs) performed during successive time periods. For a signal detection-based LBT, the LBT results in a pass when a channel reservation signal (e.g., a predetermined preamble signal) is not detected in the channel. Additionally, an LBT may be in a variety of modes. An LBT mode may be, for example, a category 4 (CAT4) LBT, a category 2 (CAT2) LBT, or a category 1 (CAT1) LBT. A CAT1 LBT is referred to a no LBT mode, where no LBT is to be performed prior to a transmission. A CAT2 LBT refers to an LBT without a random back-off period. For instance, a transmitting node may determine a channel measurement in a time interval and determine whether the channel is available or not based on a comparison of the channel measurement against a ED threshold. A CAT4 LBT refers to an LBT with a random back-off and a variable contention window (CW). For instance, a transmitting node may draw a random number and back-off for a duration based on the drawn random number in a certain time unit.

In some aspects, a transmitting device (e.g., a BS 105 or a UE 115) may encode information (message) data bits according to a certain encoding or error correction coding scheme, for example, to improve communication reliability. The transmitting device may modulate the encoded information onto frequency subcarriers according to a certain modulation scheme for transmission. To improve channel capacity, the transmitting device may apply constellation shaping to the modulation to generate non-uniformly distributed modulation symbols with a certain probability of distribution. According to aspects of the present disclosure, the transmitting device may utilize MCDM with arithmetic coding techniques to provide non-uniformly distributed modulation symbols for transmissions. Further, a receiving device (e.g., a BS 105 or a UE 115) receiving a MCDM encoded transmission may perform MCDM decoding to recover the originally transmitted information bits from the received transmission. Mechanisms for performing MCDM encoding and MCDM decoding are described in greater detail herein.

Figure 2:
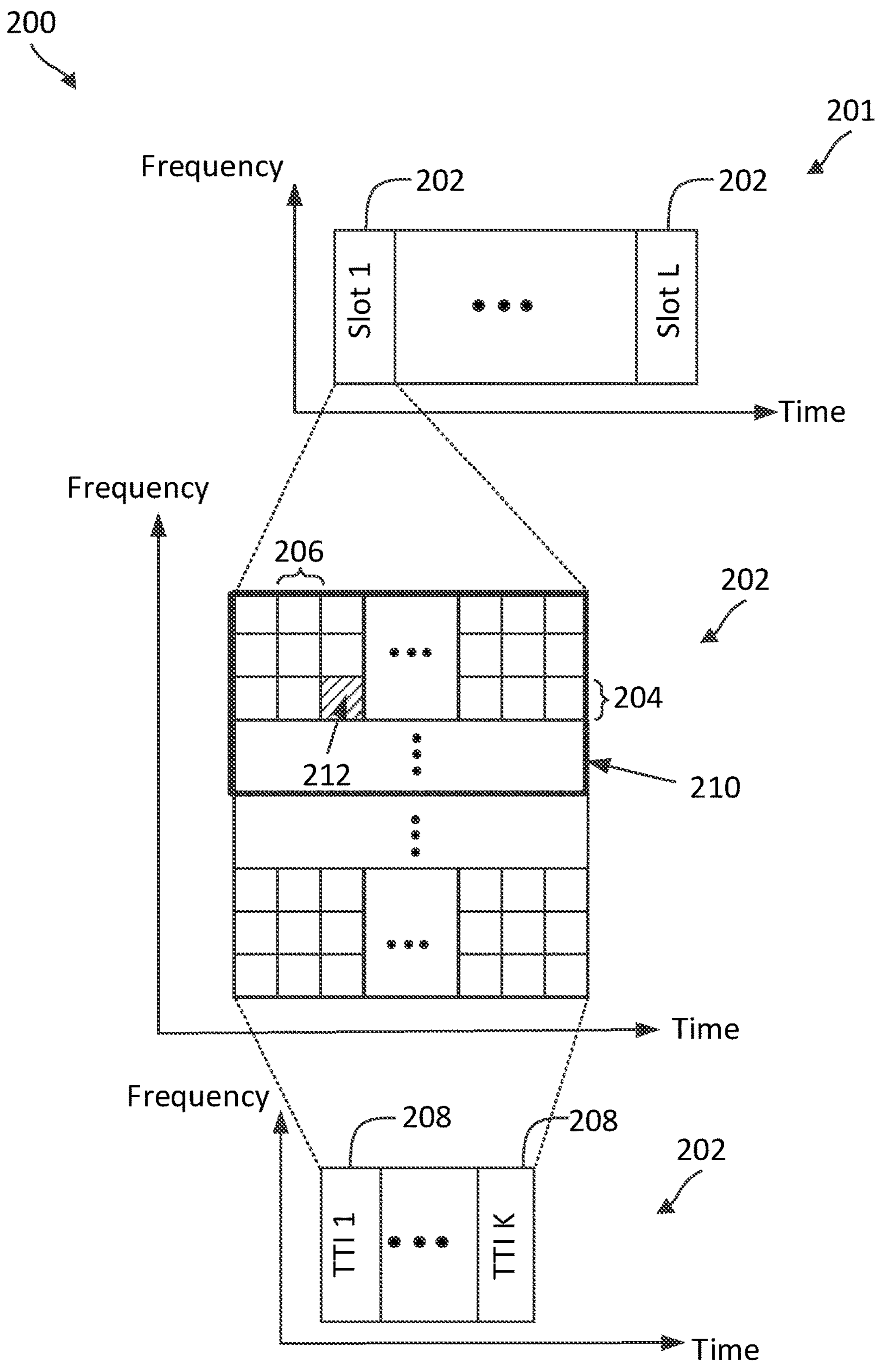
FIG. 2 is a timing diagram illustrating a radio frame structure according to some aspects of the present disclosure

FIG. 2 is a timing diagram illustrating a radio frame structure 200 according to some aspects of the present disclosure. The radio frame structure 200 may be employed by BSs such as the BSs 105 and UEs such as the UEs 115 in a network such as the network 100 for communications. In particular, the BS may communicate with the UE using time-frequency resources configured as shown in the radio frame structure 200. In FIG. 2, the x-axes represent time in some arbitrary units and the y-axes represent frequency in some arbitrary units. The radio frame structure 200 includes a radio frame 201. The duration of the radio frame 201 may vary depending on the aspects. In an example, the radio frame 201 may have a duration of about ten milliseconds. The radio frame 201 includes L number of slots 202, where L may be any suitable positive integer. In an example, L may be about 10.

Each slot 202 includes a number of subcarriers 204 in frequency and a number of symbols 206 in time. The number of subcarriers 204 and/or the number of symbols 206 in a slot 202 may vary depending on the aspects, for example, based on the channel bandwidth, the subcarrier spacing (SCS), and/or the CP mode. One subcarrier 204 in frequency and one symbol 206 in time forms one resource element (RE) 212 for transmission. A resource block (RB) 210 is formed from a number of consecutive subcarriers 204 in frequency and a number of consecutive symbols 206 in time.

In an aspect, a BS (e.g., BS 105 in FIG. 1) may schedule a UE (e.g., UE 115 in FIG. 1) for UL and/or DL communications at a time-granularity of slots 202 or less than a slot 202. For instance, the BS 105 may schedule the UE 115 in units of TTIs 208. Each slot 202 may be time-partitioned into K number of TTIs 208. Each TTI 208 may include one or more symbols 206. A TTI 208 in a slot 202 may have variable lengths. For instance, when a slot 202 includes N number of symbols 206, a TTI 208 may have a length between one symbol 206 and (N−1) symbols 206. In some aspects, a TTI 208 may have a length of about two symbols 206, about four symbols 206, or about seven symbols 206. In some instances, the BS may schedule UE 115 at a frequency-granularity of an RB 210 (e.g., including about 12 subcarriers 204).

Figure 3:
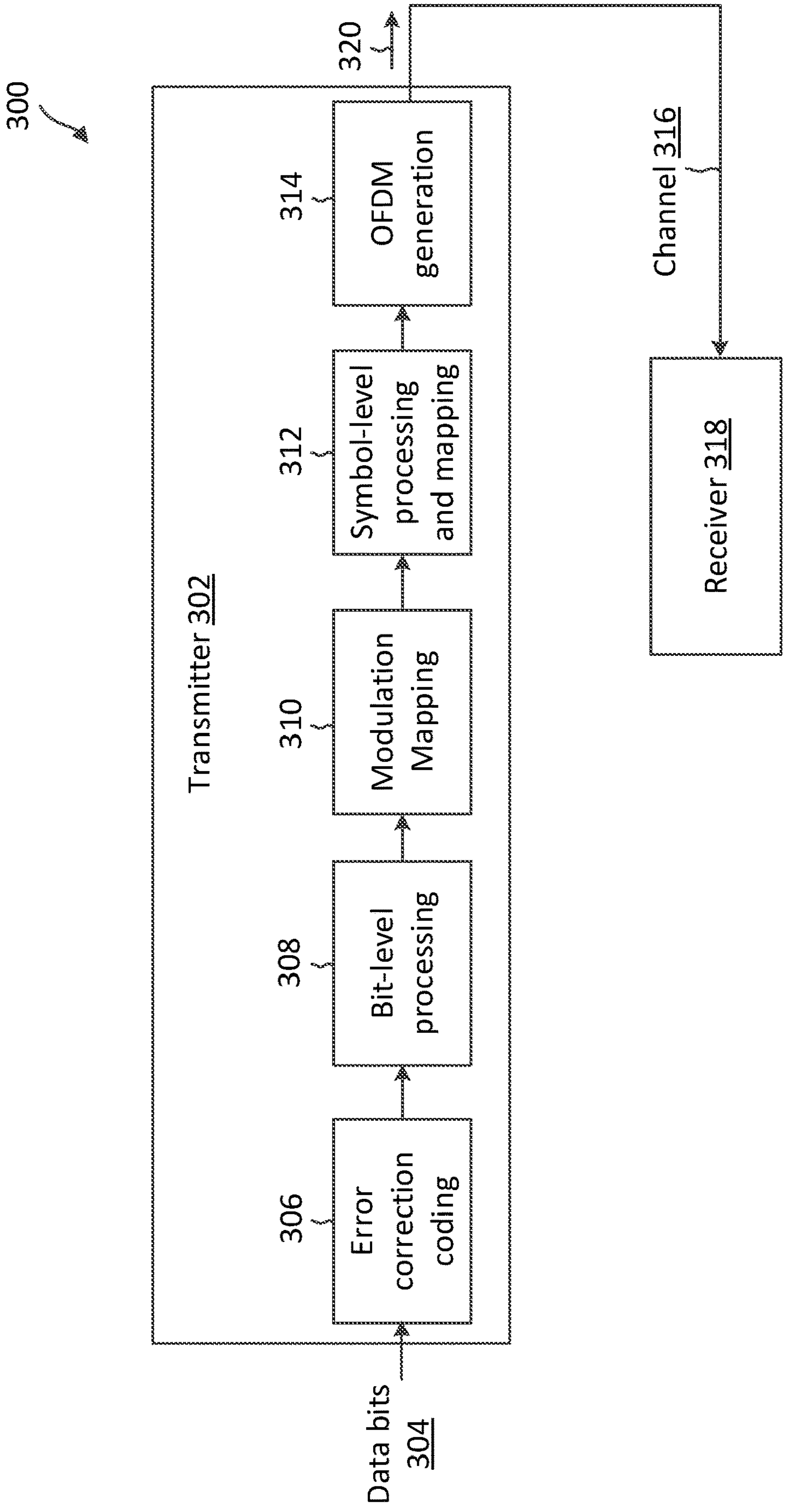
FIG. 3 illustrates a wireless communication network according to some aspects of the present disclosure.

FIG. 3 illustrates a wireless communication network 300 according to some aspects of the present disclosure. The network 300 may correspond to a portion of the network 100. The network 300 includes a transmitter 302 in communication with a receiver 318 over a wireless communication channel 316. In some aspects, the transmitter 302 may correspond to a BS 105 and the receiver 318 may correspond to a UE 115, for example, for DL communications. In some other aspects, the transmitter 302 may correspond to a UE 115 and the receiver 318 may correspond to a BS 105, for example, for UL communications. In some further aspects, the transmitter 302 may correspond to a UE 115 and the receiver 318 may correspond to another UE 115, for example, for sidelink communications.

The transmitter 302 may include hardware and/or software blocks configured to generate a communication signal 320 from a sequence of data bits 304 for transmission in the channel 316. FIG. 3 illustrates physical layer processing at the transmitter 302. For instance, the transmitter 302 may include, but not limited to, an error correction coding block 306, a bit-level processing block 308, a modulation mapping block at 310, a symbol-level processing and mapping block 312, and an OFDM generation block 314.

The error correction coding block 306 employs forward error correction to map sequences of data message bits 304 (e.g., information blocks, code blocks, code block groups, etc.) to longer, redundant sequences (e.g., codewords). That is, in order for transmissions over a noisy channel 316 to obtain a low block error rate (BLER) while still achieving very high data rates, an error correction coding block 306 may implement channel coding. Wireless communication according to various aspects of this disclosure may generally utilize any suitable error correcting block code. In a typical block code, an information message or sequence is split up into code blocks (CBs), and an encoder (e.g., a CODEC) at the transmitting device then mathematically adds redundancy to the information message. Exploitation of this redundancy in the encoded information message can improve the reliability of the message, enabling correction for bit errors that may occur due to the noise.

In 5G NR specifications, user data may be coded using quasi-cyclic low-density parity check (LDPC) with two different base graphs: one base graph for large code blocks and/or high code rates, while the other base graph is used otherwise. Control information and a physical broadcast channel (PBCH) may be coded using Polar coding, based on nested sequences. For these channels, puncturing, shortening, and repetition are used for rate matching.

Those skilled in the art will understand that aspects of the present disclosure may be implemented utilizing any suitable channel code. Various implementations of scheduling entities (e.g., BS 105 or UE 115) and scheduled entities (e.g., UE 106) may include suitable hardware and capabilities (e.g., an encoder, a decoder, and/or a CODEC) to utilize one or more of these channel codes for wireless communication.

The bit-level processing block 308 can perform various functions such as scrambling, interleaving, etc., on the output of the error correction coding block 306 at a bit level. Scrambling is a binary bit-level processing that provides a resulting binary sequence appear to be more random. In some instances, a certain scrambling sequence can be used for the scrambling, where the scrambling sequence can function as a signature, for example, to represent a certain identifier (ID). Bit-interleaving is a binary bit-level processing that reorders data that is to be transmitted so that consecutive data bits are distributed over a longer sequence of data bits to reduce the effect of burst errors.

The modulation mapping block 310 maps sequences of bits output by the bit-level processing block 308 to corresponding symbols (e.g., complex numbers) according to a selected modulation scheme. Modulation refers to the way a carrier signal is modulated, or varied over time, to represent information to be transmitted. QAM-based techniques are commonly used for wireless communication since QAM is an effective technique for carrying binary digits (bits) of information, where a symbol of bits is represented by transmission of two 90° out-of-phase sinusoidal signals (e.g., orthogonal or quadrature signals) at a given carrier frequency (e.g., a subcarrier or tone). Some examples of QAM-based modulations may include 4-QAM, 8-QAM, 16-QAM, 32-QAM, 64-QAM, 128-QAM, 256-QAM, etc. As explained above, a uniform QAM constellation may not achieve the Shannon's capacity. Thus, constellation shaping may be applied to provide a certain constellation symbol distribution for transmission rate improvement or rate loss reduction. An example of a PAS-based DM encoding scheme is discussed below with reference to FIG. 4.

The symbol-level processing and mapping block 312 performs various functions, such as layer mapping, resource mapping, symbol-level interleaving, antenna mapping, etc., on the output of the modulation mapping block 310. Symbol-level interleaving may use substantially similar techniques as bit-level interleaving to reorder modulation symbols that is to be transmitted so that consecutive modulation symbols are distributed over a longer sequence of data modulation symbols to reduce the effect of burst errors.

The OFDM generation block 314 generates signal(s) 320 from the output of the symbol-level processing and mapping block 312 for transmission over a set of one or more antennas (e.g., via antennas 1016 with reference to FIG. 10 or antennas 1116 with reference to FIG. 11), using OFDM techniques. That is, an air interface may be defined according to a two-dimensional grid of resource elements, defined by separation of resources in frequency by defining a set of closely spaced frequency tones or sub-carriers, and separation in time by defining a sequence of symbols having a given duration as discussed above with reference to FIG. 2. By setting the spacing between the tones based on the symbol rate, inter-symbol interference can be essentially eliminated. OFDM channels provide for high data rates by allocating a data stream in a parallel manner across multiple subcarriers. In any case, the OFDM generation block 314 may transmit (e.g., via antennas 1016 with reference to FIG. 10 or antennas 1116 with reference to FIG. 11), a signal 320 having a waveform modulated according to a sequence of symbols generated by symbol-level processing and mapping block 312. In some aspects, the transmitter 302 may also insert a sequence of pilot symbols in the signal 320. The sequence of pilot symbols may be a predetermined sequence known by the receiver 318, and thus may assist the receiver 318 in estimating a response for the channel 316.

A signal 320 output by the transmitter 302 propagates over the channel 316 and arrives at the receiver 318. As used herein, a "channel" generally refers to a medium through which a signal passes. Once the transmitter 302 transmitted a signal 320 over the channel 316, noise in the channel 316 (e.g., random disturbances) can affect the signal 320 before the signal 320 arrives at the receiver 318. The receiver 318, then, attempts to process the received signal and reproduce the original information message data bits 304 transmitted by the transmitter 302. The receiver 318 may perform similar processing as the transmitter 302, but in a reverse order. For instance, the receiver 318 may estimate a response of the channel 316 based on the pilot symbols in the received signal 320, perform demodulation based on the estimated channel response, perform symbol-level processing (e.g., symbol-level de-interleaving), perform modulation de-mapping, perform bit-level processing (e.g., bit-level de-interleaving and descrambling), and perform error correction decoding to recover the data bits 304.

As explained above, QAM typically employs a uniform constellation map having a uniform (e.g., grid-like) distribution of symbols in the complex plane, and a uniform probability of use of constellation symbols. QAM employing uniform constellation mapping may be limited to an achievable capacity that fails to meet the Shannon's channel capacity. A non-uniform distribution of constellation symbols, however, can improve channel performance with QAM, with an achievable capacity that better approximates or in some cases, can even essentially meet the channel capacity of the channel used to transmit an information message.

In some examples, techniques for non-uniform distribution utilizing QAM include geometric constellation shaping and/or probabilistic constellation shaping. With geometric constellation shaping, each constellation point in the complex plane is generally utilized with an equal probability, but the location of the constellation points in the complex plane is altered from the uniform grid to exhibit a generally Gaussian amplitude distribution. With probabilistic constellation shaping (PCS), also referred to in the field as probabilistic amplitude shaping (PAS), a more conventional (e.g., grid-like) uniform distribution of symbols is used in the complex plane, but with a non-equal probability of use of the respective constellation symbols.

Figure 4:
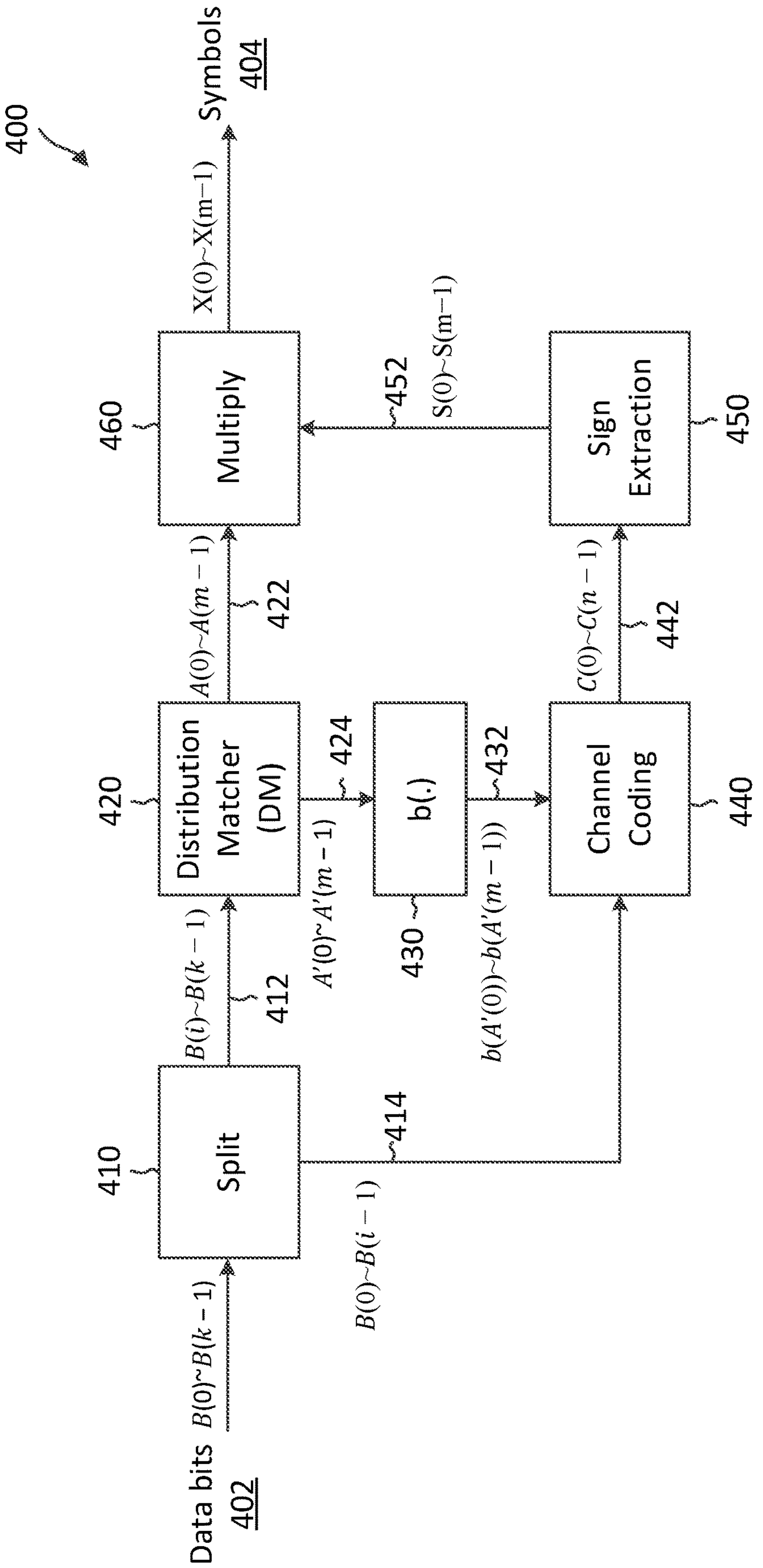
FIG. 4 illustrates a probabilistic amplitude shaping (PAS) scheme according to some aspects of the present disclosure.

FIG. 4 illustrates a PAS scheme 400 according to some aspects of the present disclosure. The scheme 400 may be employed by a wireless communication device such as the BSs 105 and/or the UEs 115 in the network 100 or the transmitter 302 of FIG. 3. In some aspects, the wireless communication device may encode a sequence of message data bits into a sequence of symbols with PAS for transmission as shown in the scheme 400. In some aspects, the transmitter 302 may implement the scheme 400 at the modulation mapping block 310 to provide modulation symbols shaped by PAS. In some aspects, when the wireless communication device utilizes the scheme 400 for modulation mapping, the wireless communication device may not perform scrambling and/or interleaving (e.g., at the bit-level processing block 308 and/or the symbol-level processing and mapping block 312) for generating the transmission as randomization from the scrambling/interleaving may destroy the target symbol distribution. In the scheme 400, a wireless communication device (e.g., a BS 105, a UE 115, or a transmitter 302) may include hardware and/or software blocks configured to encode a sequence of message data bits 402 into a sequence of symbols 404 with PAS. For instance, the wireless communication device may include a split block 410, a distribution matcher (DM) block 420, an amplitude-to-binary mapping block 430, a channel coding block 440, a sign extraction block 450, and a multiply block 460.

The wireless communication device may a obtain a sequence of k length information or message data bits 402, which may be represented as B(0)~B(k−1). In some instances, the wireless communication device may obtain the k binary data bits from a medium access control (MAC) layer entity of the wireless communication device. In some instances, the sequence of message data bits 402 may be in the form of a transport block. The split block 410 may receive the k length information or message data bits 402 and partition the k length information or message data bits into two parts or two subsets. For instance, the split block 410 may partition k length information bits into a first part 412 (e.g., Part 1) including k−i bits and a second part 414 (e.g., Part 2) including i bits. The split block 410 may send the first part 412 (e.g., Part 1) including k−i bits to the DM block 420. The first part 412 (e.g., Part 1) including k−i bits, may be represented as B(i)~B(k−1). The split block 410 may send the second part 414 (e.g., Part 2) including i bits to the channel coding block 440. The second part 414 (e.g., Part 2) including i bits may be represented as B(0)~B(i−1).

The DM block 420 may transform the first part 412 (the binary data or bit sequence B(i)~B(k−1)) into a sequence of m length shaped amplitudes 422, which may be represented as A(0)~A(m−1). The bit sequence B(i)~B(k−1) may have a distribution that is more or less uniform, and the sequence of m length shaped amplitudes may have a desired non-uniform distribution. As an example, the DM block 420 may take the first part 412 (the binary data or bit sequence B(i)~B(k−1)) as input and transform the bit sequence 412 B(i)~B(k−1) into 16-QAM symbols with a desired symbol amplitude distribution. To that end, a 16-QAM modulation may have a set of modulation symbols with amplitudes of {±1, ±3} for the in-phase (I) and the quadrature-phase (Q) components (shown in FIG. 5A). DM operations may consider the positive part of the amplitudes. That is, the DM block 420 may map the bit sequence B(i)~B(k−1) into the sequence of amplitudes having a desired distribution of values of 1 and values of 3 (with no sign information). The DM block 420 may send the sequence of amplitudes 422 A(0)~A(m−1) (having values of 1 and 3) to the multiply block 460. While 16-QAM is used for the discussion of the DM block 420, aspects are not limited thereto. To that end, the DM block 420 can apply other modulation schemes such as 4-QAM, 8-QAM, 16-QAM, 32-QAM, 64-QAM, 128-QAM, 256-QAM, etc., or any suitable modulation schemes and may provide a sequence of non-uniformly distributed amplitudes as output.

In various examples, the DM block 420 may utilize any of a number of suitable algorithms and have any of a number of suitable configurations. Some examples of DMs may include a constant-composition DM (CCDM), a prefix-free distribution matching DM (PCDM), a multiset-partition DM (MPDM), a product bit-level DM, a parallel-amplitude DM with subset ranking, a streaming DM, shell mapping, enumerative sphere shaping, framing of variable-length DM outputs into fixed-length blocks, a DM with mark ratio control, etc. Although the aforementioned DM techniques differ from one another, in general, a DM system generates a probabilistically determined sequence of symbols configured with an aim to employ a probabilistically shaped waveform (e.g., a QAM waveform).

The amplitude-to-binary mapping block 430 may map each element of the amplitude sequence (the signed amplitude symbols 424 represented as A'(0)~A'(m−1)) into a binary sequence 432 using a function represented by b(.). For example, the function b(.) may be an M-array amplitude-to-binary mapping function that generates log 2(M)*m binary bits. The binary sequence 432 may be referred to as b(A'(0))~b(A'(m−1)) and may correspond to the PAS-mapped portion of the data (e.g., the first part 412). The amplitude-to-binary mapping block 430 may send the binary bits 432 b(A'(0))~b(A'(m−1)) to the channel coding block 440.

The channel coding block 440 may take the binary sequence 432 b(A'(0))~b(A'(m−1)) and the second part 414 B(0)~B(i−1) as input and generate an encoded sequence, which may be an n-length parity bits. In various examples, the channel coding block 440 may utilize any of a number of suitable forward error coding (FEC) techniques, such as LDPC or polar coding. The channel coding block 440 may further concatenate the sequence of parity bits and the second part 414 into a binary sequence 442 of length n, which may be represented as C(0)~C(n−1), for output. The channel coding block 440 may send the binary sequence 442 C(0)~C(n−1) to the sign extraction block 450.

The sign extraction block 450 may extract a sequence of m sign bits 452, which may be represented as S(0)~S(m−1), from the parity bits C(0)~C(n−1). The multiply block 460 combines (e.g., multiplies) the sign bits 452 S(0)~S(m−1) from the sign extraction block 450 with the sequence of amplitude values 424 A(0)~A(m−1) from the DM block 420, to generate a sequence of output symbols 404, which may be represented as X(0)~X(m−1). That is, the multiplying of the sequence of amplitude values 424 A(0)~A(m−1) with the sign bits 452 S(0)~S(m−1) restores the sign information of the shaped modulation symbols 404. The wireless communication device may generate a communication signal from the modulation symbols 404 for transmission via one or more antennas (e.g., via antennas 1016 with reference to FIG. 10 or antennas 1116 with reference to FIG. 11), for example, by mapping the output symbols 404 X(0)~X(m−1) to subcarriers (e.g., the subcarriers 204) as discussed above with reference to FIG. 3.

Aspects of the present disclosure provide techniques for shaping a constellation using arithmetic coding-based MCDM techniques. In some aspects, a wireless communication device (e.g., a BS 105 or a UE 115) may determine a plurality of compositions for a certain modulation scheme to be used for transmission. As explained above, a composition is a modulation symbol distribution. For instance, a composition may include an ordered set of occurrences for each symbol in a set of M symbols of a modulation scheme. Each composition of the plurality of compositions may have a different modulation symbol distribution for the set of M symbols of the modulation scheme as will be discussed below with reference to FIGS. 5A-5B.

Figures 5A, 5B:
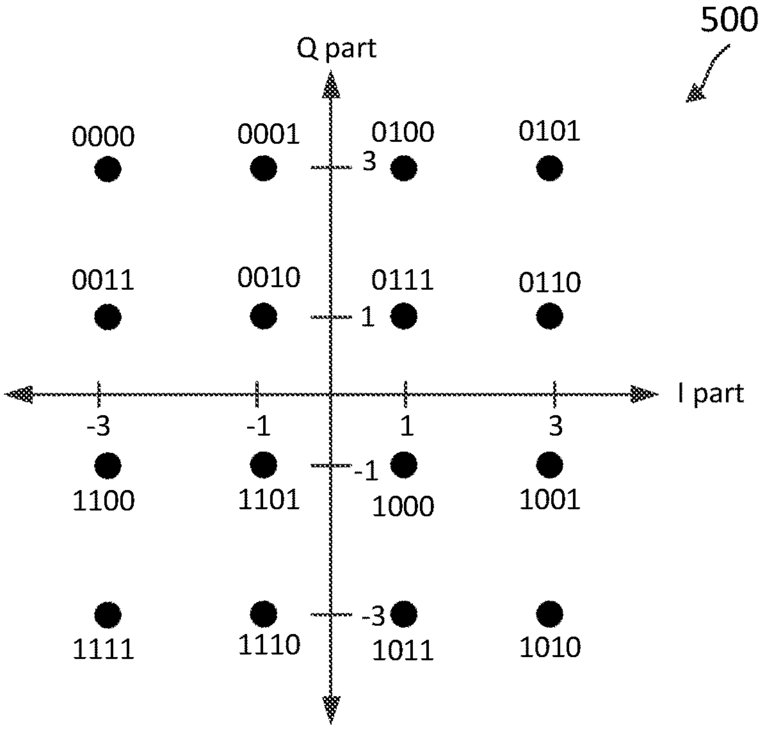
FIG. 5A illustrates a constellation diagram according to some aspects of the present disclosure.
FIG. 5B is a table illustrating multiple compositions for multiple composition distribution matcher (MCDM) encoding/decoding according to some aspects of the present disclosure.

FIGS. 5A and 5B are discussed in relation to each other to illustrate compositions for 16-QAM as an illustrative example. FIG. 5A illustrates a constellation diagram 500 according to some aspects of the present disclosure. The constellation diagram 500 illustrates a set of constellation points (shown by the solid circles) arranged in a grid (e.g., a complex plane) with the x-axis representing in-phase (I) components and the y-axis represent quadrature-phase (Q) components. In a constellation with $2^N$ constellation points, each constellation point can represent a predefined N-bit sequence or symbol. For example, in the illustration, 16-QAM is shown, with $2^4=16$ constellation points each representing a respective 4-bit sequence or symbol. By treating the amplitudes of the respective quadrature signals as representative of a real part and an imaginary part of a complex number, a transmission can represent any suitable complex number. With QAM, a modulation mapper maps an N-bit sequence to the appropriate complex number in the corresponding constellation diagram, and the amplitudes of the quadrature signals are scaled to represent the corresponding complex number.

For a sequence of fixed length n modulation symbols from a modulation symbol alphabet (e.g., set of M modulation symbols) for a certain modulation scheme, the sequence may include various combinations of symbols from the set of M modulation symbols. FIG. 5B is a table 510 illustrating multiple compositions for MCDM encoding/decoding according to some aspects of the present disclosure. In some aspects, a wireless communication device (e.g., a BS 105 or a UE 115) may utilize 16-QAM for transmission and may compose multiple compositions for MCDM encoding/decoding as shown in the table 510. For 16-QAM, each one dimension (e.g., the I-part or the Q-part of FIG. 5A) may be represented by a four-level-amplitude-shift-keying (4-ASK) with levels at [−3, −1, 1, 3]. For simplicity of illustration and discussion, FIG. 5B shows compositions for a sequence of four 16-QAM symbols, which may be represented as {Q(1), Q(2), Q(3), Q(4)}. However, compositions can be composed for a sequence of symbols of any suitable length (e.g., 5, 6, 7, 8, 9, 10 or more) and/or any suitable modulation scheme (e.g., 4-QAM, 8-QAM, 32-QAM, 64-QAM, 128-QAM, 256-QAM, etc.).

The table 510 shows all possible combinations or arrangements of amplitudes of symbols for the sequence of four 16-QAM symbols. In general, $2^n$ combinations may exist for a sequence of n-length modulation symbols. DM may operate on the positive part of the amplitudes, which may be represented as {Qa(1), Qa(2), Qa(3), Qa(4)} and may have value(s) of 1 and/or value(s) of 3. The columns 514 show the different combinations for {Qa(1), Qa(2), Qa(3), Qa(4)}. Each row in the table 510 represents one combination or arrangement of the sequence {Qa(1), Qa(2), Qa(3), Qa(4)}. Further, the table 510 groups the combinations having the same symbol amplitude distribution together in consecutive rows. A group of combinations having the same symbol amplitude distribution forms a composition. As shown, the composition 520 includes a distribution of four amplitude values of 1, the composition 522 includes a distribution of three amplitude values of 1 and one amplitude value of 3 for each combination (each row), the composition 524 includes a distribution of two amplitude values of 1 and two amplitude values of 3 for each combination (each row), the composition 526 includes a distribution of one amplitude value of 1 and three amplitude values of 3 for each combination (each row), and the composition 528 includes a distribution of four amplitude values of 3.

The column 512 shows the composition indices. For instance, the composition index 1 may reference the composition 520, the composition index 2 may reference the composition 522, the composition index 3 may reference the composition 524, the composition index 4 may reference the composition 526, and the composition index 5 may reference the composition 528.

The column 516 shows the number of hypotheses for each composition 520, 522, 524, 526, and 528. The number of hypotheses for each composition 520, 522, 524, 526, and 528 corresponds to the number of possible combinations for the sequence {Qa(1), Qa(2), Qa(3), and Qa(4)} in the corresponding composition.

The column 518 shows the mean symbol power for each composition 520, 522, 524, 526, and 528. Since the symbols distribution within a composition 520, 522, 524, 526, or 528 is the same, each combination for the sequence {Qa(1), Qa(2), Qa(3), and Qa(4)} in the composition has the same mean power.

Aspects of the present disclosure provide techniques for performing MCDM encoding efficiently utilizing an arithmetic coding-based encoding. Arithmetic coding is a lossless data compression technique that encodes data (the data string) by creating a code string which represents a fractional value on the number line between 0 and 1. The arithmetic coding algorithm is symbol-wise recursive. That is, the encoding (decoding) operates upon and encodes (decodes) one data symbol per iteration or recursion. Arithmetic coding is discussed below with reference to FIG. 6. MCDM encoding with arithmetic coding is discussed below with reference to FIG. 7. Selection of a composition from multiple compositions is discussed below with reference to FIGS. 8A and 8B. MCDM decoding with arithmetic coding is discussed below with reference to FIG. 9.

Figure 6:
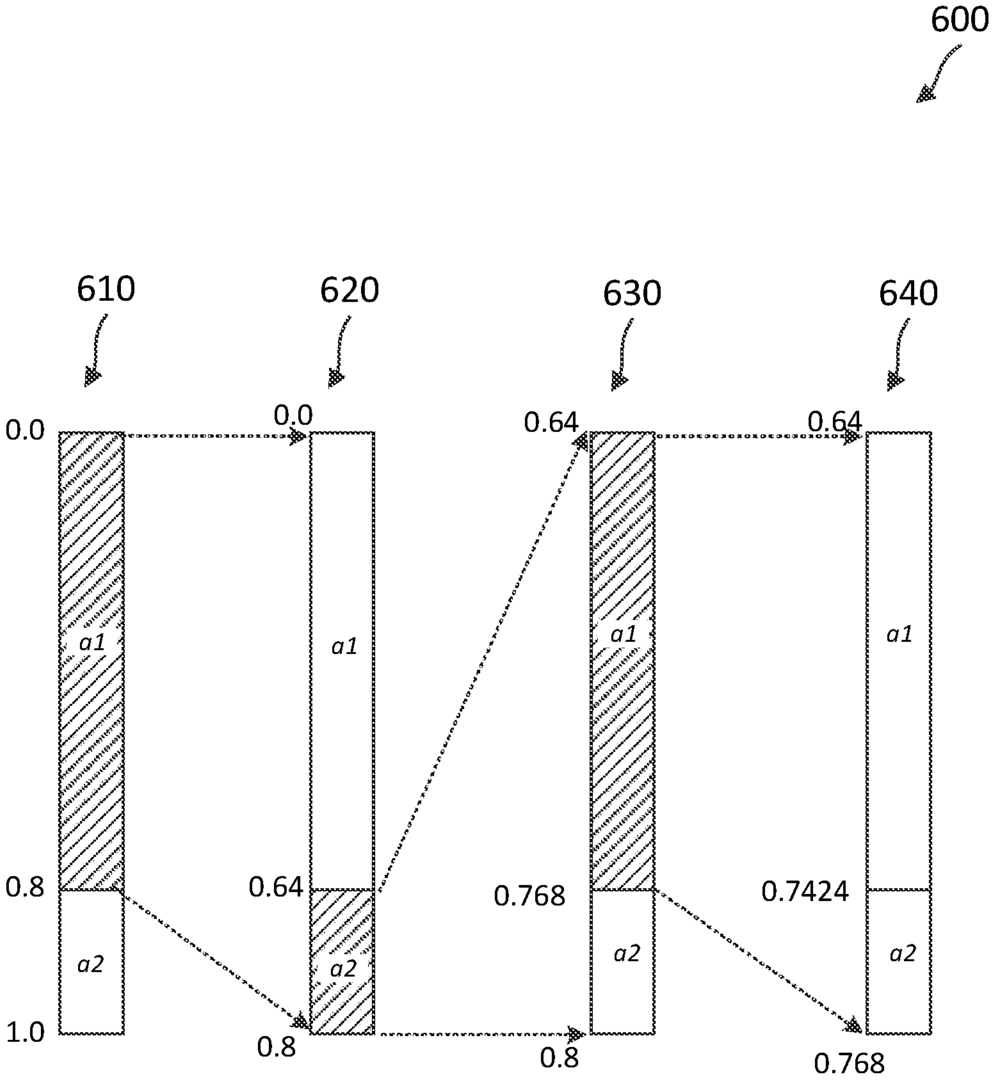
FIG. 6 illustrates an arithmetic coding scheme according to some aspects of the present disclosure.

FIG. 6 illustrates an arithmetic coding scheme 600 according to some aspects of the present disclosure. The scheme 600 may be employed by a wireless communication device such as the BSs 105 and/or the UEs 115 in the network 100 or the transmitter 302 of FIG. 3. In particular, the wireless communication device may perform arithmetic coding as shown in the scheme 600. For simplicity of illustration and discussion, FIG. 6 shows arithmetic encoding for a sequence Y with three symbols generated from a two-symbol alphabet {a1, a2} with a generation probability of 0.8 for a1 and a generation probability of 0.2 for a2. However, the scheme 600 can be applied to encode a sequence of symbols having any suitable length (e.g., 2, 3, 4, 5, or more). Additionally, the alphabet may include any suitable number of symbols (e.g., 3, 4, 5, or more) and each symbol in the alphabet may have any suitable generation probability such that the probabilities of all symbols in the alphabet add up to 1.0. In some aspects, the alphabet {a1, a2} may correspond to binary values of 1 and 0. In some other aspects, the alphabet {a1, a2} may correspond to the positive parts of the amplitudes of a set of modulation symbols for a certain modulation scheme.

In the illustrated example of FIG. 6, the sequence Y includes {a1, a2, a1} (e.g., Y(0)=a1, Y(1)=a2, and Y(2)=a1). At an initial iteration 610 (first iteration), the symbol a1 has a probability of generation of 80 percent (%), represented by a sub-interval [0.0~0.8] within a first interval between 0 and 1.0. The symbol a2 has a probability of generation of 20%, represented by a sub-interval [0.8~1.0] within the first interval.

When the first symbol a1 (e.g., Y(0)) of the sequence Y is encoded (shown by the pattern-filled box), the upper 80% sub-interval (e.g., [0.0~0.8]) is updated as a new second interval for the next second iteration 620. That is, the second interval for the second iteration 620 is scaled to be between 0.0 and 0.8 (e.g., [0.0~0.8]) as shown by the dotted arrows from the first iteration 610 to the second iteration 620. The probability of generations for the symbols a1 and a2 are scaled proportionally in the second iteration 620. That is, the probability of generations for the symbol a1 becomes 0.8 within the second interval [0.0~0.8], and thus the symbol a1 may be within the upper sub-interval between 0.0 and 0.64 (e.g., [0.0~0.64]) in the second interval. In a similar way, the probability of generations for the symbol a2 becomes 0.2 within the second interval [0.0~0.8], and thus the symbol a2 may be within the lower sub-interval between 0.64 and 0.8 (e.g., [0.64~0.8]) in the second interval.

At the second iteration 620, when the second symbol a2 (e.g., Y(1)) of the sequence Y is encoded (shown by the pattern-filled box), the lower 20% sub-interval (e.g., [0.64~0.8]) is updated as a new third interval for the next third iteration 630. That is, the third interval for the third iteration 630 is scaled to be between 0.64 and 0.8 (e.g., [0.64~0.8]) as shown by the dotted arrows from the second iteration 620 to the third iteration 630. Again, the probability of generations for the symbols a1 and a2 are scaled proportionally in the third iteration 630. That is, the probability of generations for the symbol a1 becomes 0.8 within the third interval [0.64~0.8], and thus the symbol a1 may be within the upper sub-interval between 0.64 and 0.768 (e.g., [0.64~0.768]) in the third interval. In a similar way, the probability of generations for the symbol a2 becomes 0.2 within the third interval [0.64~0.8], and thus the symbol a2 may be within the lower sub-interval between 0.768 and 0.8 (e.g., [0.768~0.8]) in the third interval.

At the third iteration 630, when the third symbol a1 (e.g., Y(2)) of the sequence Y is encoded (shown by the pattern-filled box), the upper 80% sub-interval (e.g., [0.64~0.768]) is updated as a new fourth interval for the next fourth iteration 640 as shown by the dotted arrows from the third iteration 630 to the fourth iteration 640. That is, the fourth interval for the fourth iteration 640 is scaled to be between 0.64 and 0.768 (e.g., [0.64~0.768]). Again, the probability of generations for the symbols a1 and a2 are scaled proportionally in the fourth iteration 640. That is, the probability of generations for the symbol a1 becomes 0.8 within the fourth interval [0.64~0.768], and thus the symbol a1 may be within the upper sub-interval between 0.64 and 0.7424 (e.g., [0.64~0.7424]) in the fourth interval. In a similar way, the probability of generations for the symbol a2 becomes 0.2 within the fourth interval [0.64~0.768], and thus the symbol a2 may be within the lower sub-interval between 0.7424 and 0.768 (e.g., [0.7424~0.768]) in the fourth interval.

The fourth iteration 640 is a final iteration as the sequence Y includes 3 symbols. A codeword for the sequence Y may be obtained by quantizing the border value 0.7424 or the border value 0.768 of the fourth interval.

Figure 7:
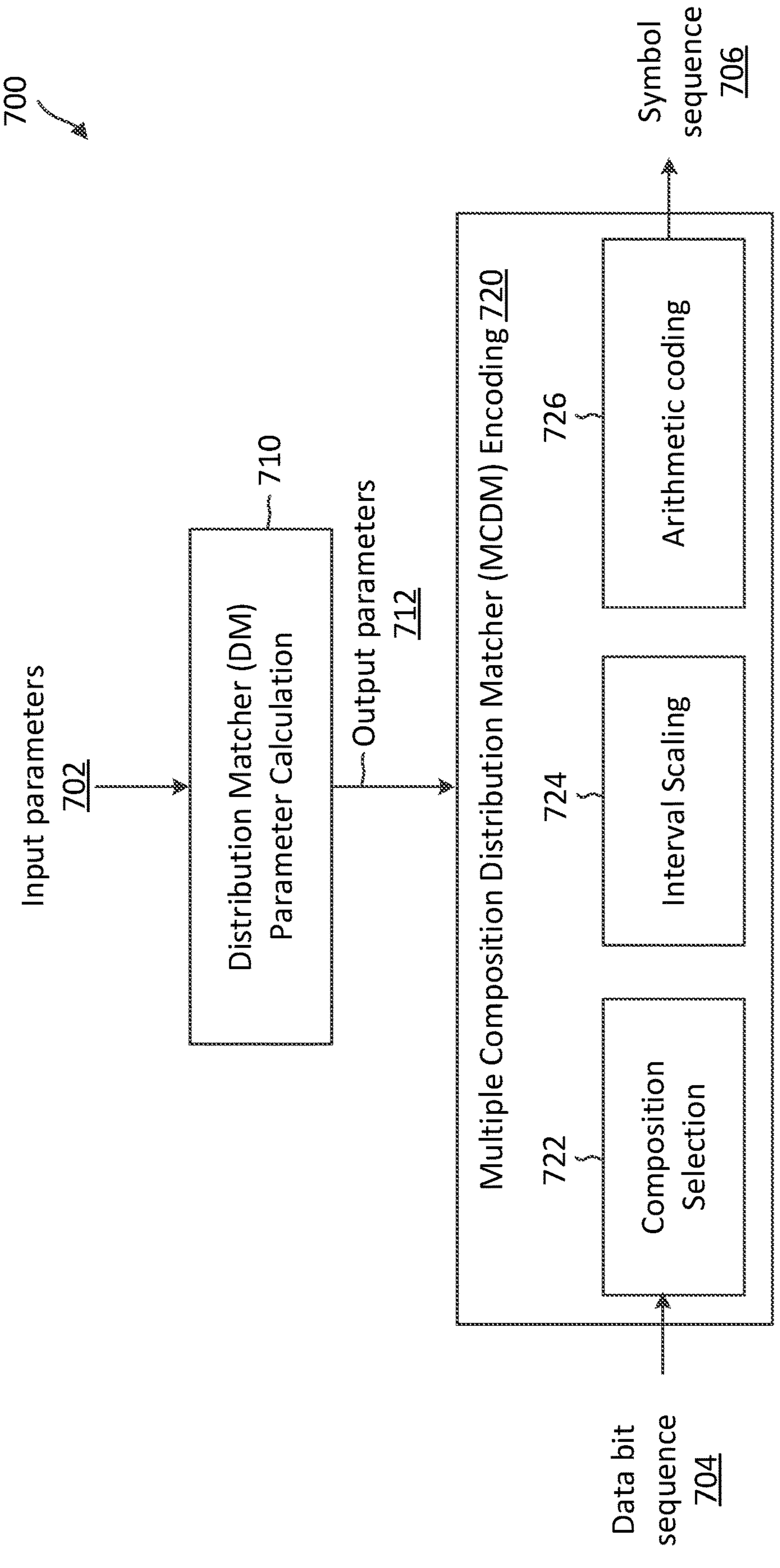
FIG. 7 illustrates an MCDM encoding scheme according to some aspects of the present disclosure.
Figure 8A:
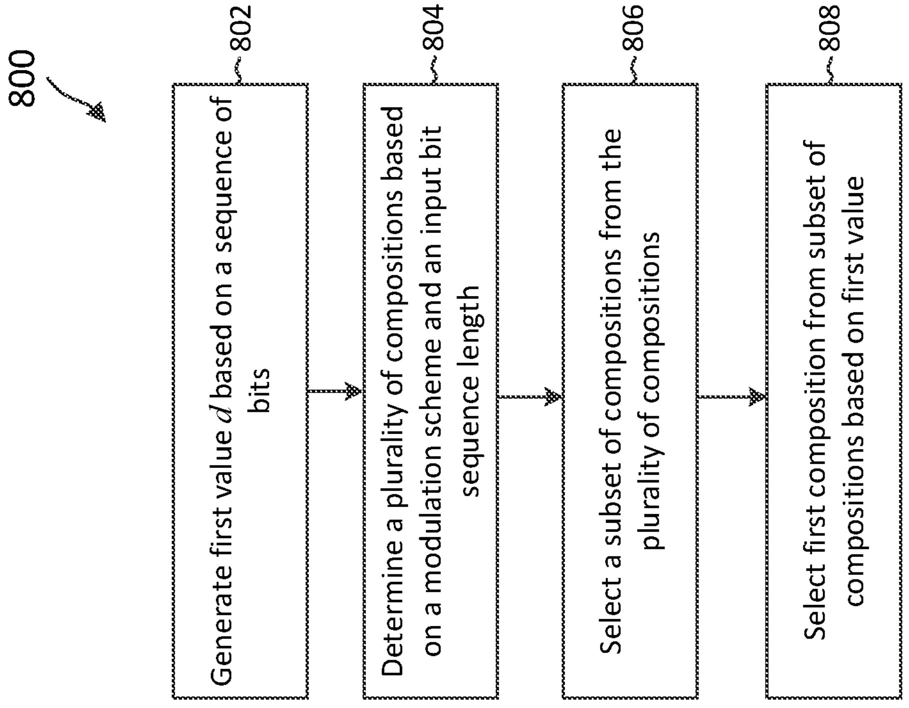
FIG. 8A is a flow diagram of a composition selection method for MCDM encoding according to some aspects of the present disclosure.
Figure 8B:
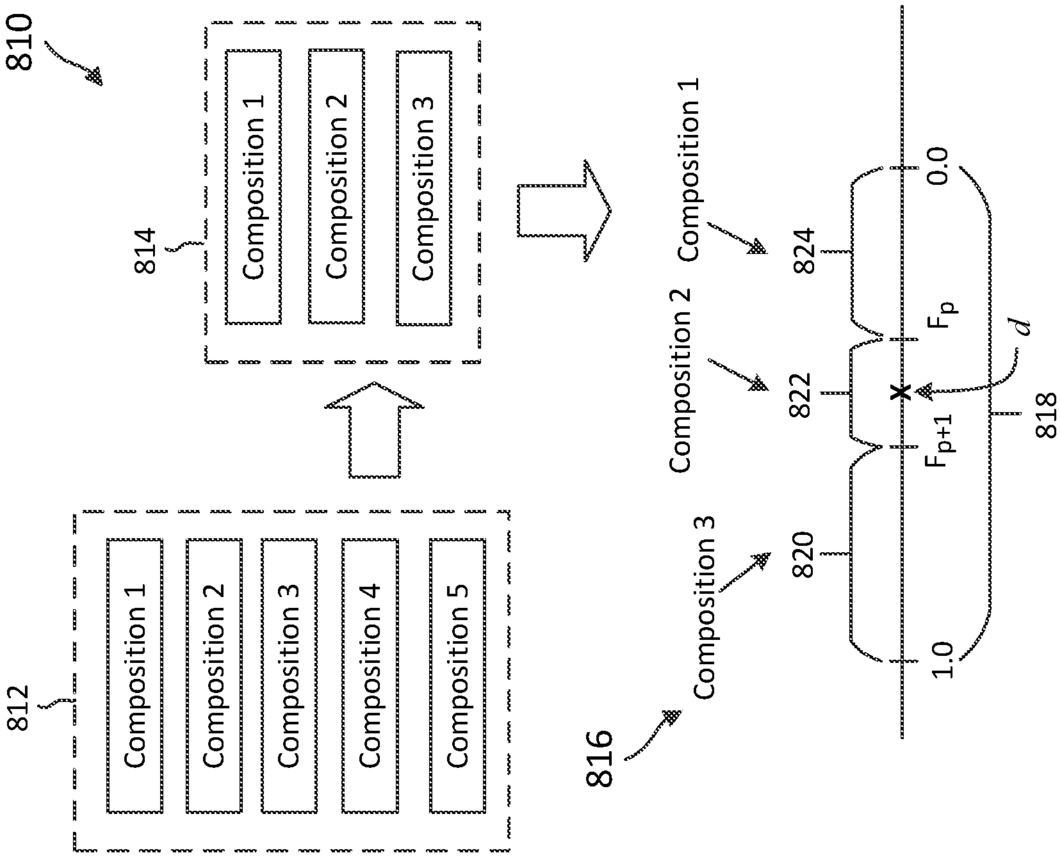
FIG. 8B illustrates a composition selection method for MCDM encoding according to some aspects of the present disclosure.

FIGS. 7 and 8A-8B are discussed in relation to each other to illustrate MCDM encoding. FIG. 7 illustrates an MCDM encoding scheme 700 according to some aspects of the present disclosure. The scheme 700 may be employed by a wireless communication device such as the BSs 105 and/or the UEs 115 in the network 100 of FIG. 1 or the transmitter 302 of FIG. 3. In particular, the wireless communication device may perform MCDM encoding to generate a transmission with a non-uniform modulation symbol distribution as shown in the scheme 700. The non-uniform modulation symbol distribution can increase the maximum transmission capacity for a given SNR and bandwidth. In some aspects, the DM block 420 may implement the scheme 700 to provide modulation symbols with a non-uniform distribution having a target probability of distribution.

In the scheme 700, a wireless communication device (e.g., a BS 105, a UE 115, or a transmitter 302) may include hardware and/or software blocks configured to encode a sequence of message data bits 704 into a sequence of symbols 706. For instance, the wireless communication device may include a DM parameter calculation block 710 and an MCDM encoding block 720. The MCDM encoding block 720 may include a composition selection block 722, an interval scaling block 724, and an arithmetic coding block 726.

At a high level, the DM parameter calculation block 710 may receive a set of input parameters 702 and provide a set of output parameters 712 to the MCDM encoding block 720. The set of output parameters 712 may be used to configure the MCDM encoding block 720. The MCDM encoding block 720 may receive a sequence of bits 704 (e.g., information bits received from a MAC layer of the wireless communication device) and provide a sequence of symbols 706. The sequence of bits 704 may have a distribution that is more or less uniform, and the sequence of symbols 706 may have a non-uniform distribution with a desired probability of distribution.

The DM parameter calculation block 710 may receive a set of input parameters 702 including at least one of a DM rate, an output symbol length (e.g., a first number of symbols in the sequence of symbols 706), or amplitudes of a set of modulation symbols. For instance, the DM rate may be determined by a modulation scheme and a FEC coding rate used for generating a transmission signal. The modulation scheme may be 4-QAM, 8-QAM, 16-QAM, 32-QAM, 64-QAM, 128-QAM, 256-QAM, etc. or any other types of modulation scheme. The FEC coding rate may be ½, ⅓, ⅔, ⅚, ⅞, etc. In some aspects, the modulation scheme and the FEC coding rate may be assigned by a grant that schedules the transmission. The combination of the modulation scheme and the FEC coding rate may be referred to as an MCS. The output symbol length (e.g., represented as n) may be determined by the MCS and the number of time-frequency resources (e.g., the REs 212 of FIG. 2) available for the transmission. In some aspects, the number of time-frequency resources allocated for the transmission may be indicated by the grant that schedules the transmission. In some aspects, when the wireless communication device is a UE (e.g., a UE 115), the wireless communication device may receive the grant from a BS (e.g., a BS 105). In other aspects, when the wireless communication device is a BS (e.g., a BS 105), the wireless communication device may schedule the transmission. Accordingly, the wireless communication device may have information about the MCS and the resources used for transmitting the communication signal. The amplitudes of the set of modulation symbols may be determined by the modulation scheme. Referring to the example discussed above with reference to FIGS. 5A and 5B, the amplitudes for the set of 16-QAM symbols which is 4-ASK having values of {1, 3}. As a further example, the amplitudes for a set of 64-QAM symbols is 8-ASK having values {1, 3, 5, 7}.

The DM parameter calculation block 710 may calculate a set of output parameters 712 including at least one of an input bit sequence length (e.g., a second number of bits in the sequence of bits 704) or a set of selected compositions and associated properties. In some aspects, the DM parameter calculation block 710 may calculate the input bit length (e.g., represented as k) based on the following relationship:

$$DM\ \text{rate} = \frac{k}{n}. \qquad (1)$$

Further, the DM parameter calculation block 710 may determine a plurality of compositions based on the modulation scheme. The plurality of compositions may be formed from $2^k$ number of possible combinations of modulation symbol amplitudes as discussed above with reference to FIG. 5B. As an example, there may be T number of compositions in the plurality of compositions, for example, represented as {c(1), c(2), c(3), . . . , c(T)}. The probability $P_c$ for each composition c(i) may be represented by the following relationship:

$$P_c = \frac{N_c}{2^k}, \qquad (2)$$

where $N_c$ represents the number of sequences or combinations that are in composition c(i) and the summation of the number of sequences or combinations for all compositions c(i) is $2^k$, which may be represented as $\Sigma_c N_c = 2^k$. Referring to the example discussed above with reference to FIGS. 5A and 5B, for 16-QAM, there are 5 compositions 520, 522, 524, 526, and 528. That is, the value T is 5. Additionally, the $N_c$ value corresponds to the number of hypotheses in a corresponding composition. That is, the $N_c$ value for the composition 520 is 1, the $N_c$ value for the composition 522 is 4, the $N_c$ value for the composition 524 is 6, the $N_c$ value for the composition 526 is 4, and the $N_c$ value for the composition 528 is 1. Each composition c(i) may have a certain symbol distribution. The symbol distribution for 16-QAM may be represented by the following relationship:

$$\Sigma_{j \in \{1,3\}} m_j = n, \qquad (3)$$

where $m_j$ represents the frequency or number of occurrences for each symbol in a sequence within the composition c(i). In some aspects, the probability of occurrence for a symbol in a composition can be computed from the probability of occurrence for the composition (e.g., $P_c$) and the probability of occurrence for the symbol within the composition. Although equation (3) is shown for a symbol distribution of 16-QAM symbols, it should be understood that equation (3) can be applied to represent a symbols distribution for a different modulation scheme. For instance, the set j may include amplitudes of modulation symbols of the corresponding modulation scheme. For example, for 64-QAM, the set of amplitudes j may include {1, 3, 5, 7} instead of {1,3} as shown in equation (3).

Further, the DM parameter calculation block 710 may select a subset of the plurality of compositions based on the set of input parameters 702. In some aspects, the DM parameter calculation block 710 may select the subset of compositions from the plurality of compositions based on at least one of the DM rate associated with the modulation scheme and the error coding rate, the first number of symbols in the sequence of symbols 706, or amplitudes of the set of modulation symbols associated with the modulation scheme. In some aspects, the DM parameter calculation block 710 may select the subset of compositions from the plurality of compositions based on certain rules, which may include, but not limited to, multi-partition DM (MPDM) or sphere shaping. For MPDM, the DM parameter calculation block 710 may define an average target symbol probability distribution. The target symbol distribution may also determine the upper bound of the DM rate as $$\frac{k}{n} \leq H(x),$$

where H(x) is the entropy of the symbol distribution. Subsequently, the DM parameter calculation block 710 may select T compositions and select a number of sequences in each composition so that the averaged symbol distribution of the T compositions reaches the target symbol distribution. For sphere shaping, the DM parameter calculation block 710 may select T compositions with the smallest (or lowest) mean symbol power until reaching a target DM rate $$\left(\text{e.g., } DM \text{ rate} = \frac{k}{n}, \text{ where } \Sigma_c N_c = 2^k\right).$$

In general, the DM parameter calculation block 710 may select the subset of compositions from the plurality of compositions based on any suitable rules. In some aspects, the DM parameter calculation block 710 may select the subset of compositions from the plurality of compositions based on a predetermined rule known by the wireless communication device and a corresponding or peer receiving wireless communication device. In some aspects, the rule used by the DM parameter calculation block 710 for selecting the subset of compositions from the plurality of compositions can be indicated to a corresponding or peer receiving wireless communication device. The DM parameter calculation block 710 may indicate, in the output parameters 712, the selected subset of compositions and associated properties (e.g., the modulation symbol distribution) for each composition in the subset.

The MCDM encoding block 720 may perform MCDM encoding based on the set of output parameters 712. For instance, the MCDM encoding block 720 may obtain the sequence of bits 704 having k number of bits, where the value k is part of the set of output parameters 712 output by the DM parameter calculation block 710. The composition selection block 722 may take the k-length sequence of bits 704 as input and provide a symbol distribution of the selected composition, a lower border value and an upper border value of an interval of the selected composition. Mechanisms for selecting a composition based on the k-length sequence of bits 704 are discussed below with reference to FIGS. 8A-8B.

FIG. 8A is a flow diagram of a composition selection method 800 for MCDM encoding according to some aspects of the present disclosure. Aspects of the method 800 can be executed by a computing device (e.g., a processor, processing circuit, and/or other suitable component) of a wireless communication device or other suitable means for performing the blocks. In some aspects, a wireless communication device, such as a BS 105 or BS 1000, may utilize one or more components, such as the processor 1002, the memory 1004, the MCDM encoding module 1008, the MCDM decoding module 1009, the transceiver 1010, the modem 1012, the RF unit 1014, and the one or more antennas 1016 shown in FIG. 10, to execute the blocks of method 800. In some aspects, a wireless communication device, such as a UE 115 or UE 1100, may utilize one or more components, such as the processor 1102, the memory 1104, the MCDM encoding module 1108, the MCDM decoding module 1109, the transceiver 1110, the modem 1112, the RF unit 1114, and the one or more antennas 1116 shown in FIG. 11, to execute the blocks of method 800. The method 800 may employ similar mechanisms as described in FIGS. 5A-5B and 7. As illustrated, the method 800 includes a number of enumerated blocks, but aspects of the method 800 may include additional blocks before, after, and in between the enumerated blocks. In some aspects, one or more of the enumerated blocks may be omitted or performed in a different order.

At block 802, a wireless communication device (e.g., a BS 105 or a UE 115) generates a first value d based on the k-length sequence of bits 704. The first value d may be a dyadic point, which may be represented as d∈[0, 1]. That is, the first value d is a decimal value greater than or equal to 0 and less than 1. In some aspects, the wireless communication device may apply a binary-to-decimal conversion function to the k-length sequence of bits 704 to obtain the first value d as shown below:

$$d = \frac{\sum_{i=0}^{i=k-1} b_i \times 2^i}{2^k}, \tag{4}$$

where $b_i$ represents the i-th bit in the k-length sequence of bits 704.

At block 804, the wireless communication device determines a plurality of compositions based on a modulation scheme and the input bit sequence length (e.g., the length k of the sequence of input bits 704). For instance, the wireless communication device may determine $2^k$ number of combinations of amplitude symbols (the positive part of the amplitudes of the modulation symbols) for the modulation scheme as discussed above. The wireless communication device may group the combinations of amplitude symbols having the same symbol distribution into a composition.

FIG. 8B illustrates a composition selection method 810 for MPCM encoding according to some aspects of the present disclosure. FIG. 8B provides a more detailed view of the method 800. As shown, the method 810 includes a plurality of compositions 812 determined from the modulation scheme. For simplicity of illustration and discussion, FIG. 8B illustrates five compositions 812 shown as composition 1, composition 2, composition 3, composition 4, and composition 5 in the plurality of compositions 812. However, the plurality of compositions 812 may include a greater number of compositions or a less number of compositions depending on the modulation scheme and the input bit sequence length k. In some aspects, for 16-QAM, the composition 1 may correspond to the composition 520, the composition 2 may correspond to the composition 522, the composition 3 may correspond to the composition 524, the composition 4 may correspond to the composition 526, and the composition 5 may correspond to the composition 528 shown in FIG. 5B.

Returning to FIG. 8A, at block 806, the wireless communication device selects a subset of compositions from the plurality of compositions, for example, based on at least one of the DM rate associated with the modulation scheme and the error coding rate, the first number of symbols in the sequence of output symbols 706, amplitudes of the set of modulation symbols associated with the modulation scheme, or a set of rules as discussed above at the DM parameter calculation block 710.

In the illustrated example of FIG. 8B, the wireless communication device selects a subset of compositions 814 including composition 1, composition 2, and composition 3 from the plurality of compositions 812. Each of the composition 814 in the subset of compositions may have a certain probability of occurrences. The probability of occurrences for the subset of compositions may be represented in an interval 818 (a number line) between a second value (e.g., 0.0) and a third value (e.g., 1.0) as shown by 816. Each composition 814 in the subset of compositions 814 corresponds to a different one of a plurality of sub intervals in the interval 818 between the second value and the third value. In some aspects, at least two of the plurality of intervals may occupy a different interval-length in the interval 818. That is, the interval 818 may be partitioned unequally among the subset of compositions 814. In other aspects, each of the plurality of intervals may occupy the same interval-length in the interval 818. That is, the interval 818 may be partitioned equally among the subset of compositions 814. In the illustrated example of FIG. 8B, the composition 1 has a probability of occurrence in the sub-interval 824 with an inclusive lower border value 0.0 and an exclusive upper border value $F_p$, the composition 2 has a probability of occurrence in the sub-interval 822 with an inclusive lower border value $F_p$ and an exclusive upper border value $F_{p+1}$, and the composition 3 has a probability of occurrence in the sub-interval 820 with an inclusive lower border value $F_{p+1}$ and an exclusive upper border value 1.0. In some examples, the sub-interval 824 may be represented as $[0.0, F_p)$, the sub-interval 822 may be represented as $[F_p, F_{p+1})$, and the sub-interval 820 may be represented as $[F_{p+1}, 1.0)$, where the square bracket "[" represents an inclusive value and round bracket ")" represents an exclusive value.

In some aspects, each composition 814 may include a number of symbol sequences according to a modulation scheme, for example, as discussed above with reference to FIG. 5. To achieve a certain constellation shape, each composition 814 may include a number of used symbol sequences. The sub-interval (e.g., the sub-interval 820, 822, and 824) of each composition 814 is proportional to the number of used symbol sequences in the composition 814. The wireless communication device may determine how many symbol sequences in each composition in a wide variety of ways. In some instances, the wireless communication device and a corresponding receiver may have the same information regarding the used symbol sequences in each composition 814.

In some aspects, the number of ordered sequences in a specific composition 814 is related to the modulation symbol distribution for a M-symbol set. For a specific composition 814, the upper bound of the total number of ordered symbol sequences is given by the following relationship:

$$N_C = \frac{n!}{n_1! \times n_2! \times \ldots \times n_M!}, \text{ where } n = n_1 + \cdots + n_M, \quad (5)$$

where n denotes the total length of the symbol sequence, $n_i$ represents the number of occurrences of each symbol from the M-symbol set. In some instances, the wireless communication device may use all the ordered symbol sequences (e.g., the total number of ordered symbols sequences according to the modulation symbols distribution) for the composition 814. In other instances, the wireless communication device may use part (a subset) of the symbol sequences for the composition 814 that is less than the total number of ordered symbols sequences for the composition 814. For instance, the actual used number of sequences for a specific composition may be $\leq N_c$. As an example, the wireless communication device may utilize two compositions, C1 and C2. The wireless communication device may configure C1 with 50 symbol sequences and may configure C2 with 100 symbol sequences. Accordingly, the ratio of C1/C2=50/100=1/2, which means the ratio of interval range (between 0 and 1): C1/C2=1/2.

Returning to FIG. 8A, at block 806, the wireless communication device selects a first composition from the plurality of compositions based on the first value d. For instance, the wireless communication device may select a sub-interval from the plurality of sub-intervals (e.g., the sub-intervals 820, 822, and 824) where the first value d falls within.

In the illustrated example of FIG. 8B, the first value d is within the sub-interval 822 as shown by the cross symbol ("X"). Accordingly, the wireless communication device may select the composition 2 corresponding to the sub-interval 822 based on the first value d being within the sub-interval 822. The sub-interval 822 is between a fourth value and a fifth value. The fourth value may correspond to the inclusive lower border value of $F_p$ and the fifth value may correspond to the exclusive upper border value of $F_{p+1}$ for the sub-interval 822. In some aspect, $F_p$ is the cumulative function of the composition c(p) given by $$F_p = \sum_{t=1}^{p-1} Prob_t,$$

where $Prob_t$ is the probability for the composition c(t).

In some aspects, the lower border value and/or the upper border value for a sub-interval (a composition) can be of any suitable precision. For example, in some instances, at least one of the lower border value $F_p$ (the fourth value) or the upper border value $F_{p+1}$ (the fifth value) for selected sub-interval 822 may be a reciprocal of a non-power-of-2 value. That is, the lower border value $F_p$ (the fourth value) and/or the upper border value $F_{p+1}$ (the fifth value) can be any fractional number and may not necessarily be representable by a binary sequence. Moreover, in practice, the lower border value $F_p$ and the upper border value $F_{p+1}$ are can be binary sequences.

As discussed above, the composition selection block 722 may take the k-length sequence of bits 704 as input and provide a symbol distribution of the selected composition, a lower border value and an upper border value of an interval of the selected composition. Accordingly, the composition selection block 722 may output the selected composition 2, the third value (the inclusive lower border value), and the fourth value (the exclusive upper border value) for the selected composition 2.

Returning now to FIG. 7, the composition selection block 722 may send the symbol distribution of the selected composition, the lower border value and the upper border value of the selected composition, and the sequence of input bits 704 to the interval scaling block 724.

The interval scaling block 724 may take the symbol distribution of the selected composition, the lower border value and the upper border value of the selected composition, and the sequence of input bits 704 as input and provide a scaled lower border value, a scaled upper border value, and a scaled input bit sequence as output. In some aspects, the interval scaling block 724 may determine a scaling factor, which may be represented as α, based on the symbol distribution (the total number of symbols to represent such distribution) in the selected composition and a precision requirement for the upper border value and/or the lower border value. For instance, the interval scaling block 724 may be utilized when the arithmetic coding block 726 is realized using a fixed-point implementation (e.g., integer implementation). That is, the arithmetic coding block 726 performs finite precision arithmetic coding (e.g., arithmetic decoding). Accordingly, in some aspects, the precision requirement may be dependent on the length n of the sequence of symbols 706. As an example, when we consider the arithmetic coding with integer implementation, if the sequence of bits 704 is mapped to a hundred 16-QAM symbols with seventy amplitude values of 1 and thirty amplitude values of 3, the scaling factor α can be computed as shown below:

$$\alpha=2^{\lceil \log 2n\rceil+\tau}=2^{\lceil \log 2(70+30)\rceil+\tau}, \tag{6}$$

where ⌈ ⌉ represents a ceiling operation, "n" is the length of the symbol sequences, and τ is determined by the precision requirement, usually, we set τ≥2 in order to distinguish the smallest difference between the endpoints of each subintervals. In general, the scaling factor α can be determined by computing a sum of the total number of symbols, applying a log-base-2 operation to the sum, and applying a ceiling operation to the log-base-2 of the sum.

The interval scaling block 724 may scale the lower border value and the upper border value of the selected composition by the scaling factor α. Thus, the sub-interval (e.g., the sub-interval 822) for the selected composition is scaled to an interval with an inclusive lower border value of $\alpha\times F_p$, and an exclusive upper border value of $\alpha\times F_{p+1}$. The scaled interval may be represented as $\alpha\times[F_p, F_{p+1})$.

Further, the interval scaling block 724 may scale the input bit sequence 704. For instance, the first value d (e.g., the dyadic point) defined by the k length sequence of input bits 704 can be scaled by α·(e.g., α×d). The interval scaling block 724 may send the scaled lower border value, the scaled upper border value, and the scaled input bit sequence to the arithmetic coding block 726.

The arithmetic coding block 726 may perform arithmetic coding on the scaled input bit sequence utilizing mechanisms to provide a sequence of symbols 706. As explained above, arithmetic decoding is used for converting bits to symbols. Accordingly, the arithmetic coding block 726 may apply arithmetic decoding techniques to the scaled input bit sequence to provide the sequence of symbols 706, for example, utilizing similar mechanisms as discussed above with reference to FIG. 6. However, the arithmetic coding block 726 may perform the arithmetic decoding with an initial interval between the scaled lower border value (e.g., $\alpha\times F_p$) and the scaled upper border value (e.g., $\alpha\times F_{p+1}$) instead of in an interval between 0.0 and 1.0 as shown in FIG. 6.

In some aspects, the arithmetic coding block 726 may utilize CCDM encoding to encode the scaled input bit sequence into the sequence of symbols 706. CCDM encoding is substantially similar to the arithmetic coding shown in FIG. 6. CCDM encoding may including performing arithmetic decoding. However, CCDM encoding may apply adaptive scaling at an intermediate iteration (e.g., the iteration 620 or 630). In some instances, CCDM may scale the interval at an intermediate iteration based on an input at a previous iteration. The interval calculation for CCDM is different from arithmetic coding because the symbol distribution may change after the CCDM encoder outputs each symbol. An example of CCDM interval calculation is provided further below.

In some aspects, the interval scaling block 724 may be bypassed. That is, the wireless communication device may not perform interval scaling, and the arithmetic coding block 726 may perform arithmetic coding beginning with the sub-interval $[F_p, F_{p+1})$. In some instances, the interval scaling block 724 may be bypassed when the arithmetic coding block 726 implements arithmetic coding using a floating-point implementation.

While FIG. 7 illustrates the interval scaling block 724 as a separate block from the composition selection block 722 and the arithmetic coding block 726, aspects are not limited thereto. To that end, the interval scaling block 724 may be implemented as part of the composition selection block 722. For instance, the composition selection block 722 may select the composition, apply a scaling factor to the lower border value and the upper border value of the selected composition, and provide the scaled lower border value and the scaled upper border value to the arithmetic coding block 726. Alternatively, the interval scaling block 724 may be implemented as part of the arithmetic coding block 726. For instance, the arithmetic coding block 726 may receive the lower border value and the upper border value for the selected composition and may apply a scaling factor to the lower border value and the upper border value of a sub-interval before performing the encoding.

As discussed above, in some aspects, the MCDM encoding scheme 700 may be implemented by the DM block 420. For instance, the wireless communication device may implement the scheme 400 with the DM block 420 implementing the scheme 700 as shown. The wireless communication device may generate modulation symbols (e.g., output symbols 404 X(0)~X(m−1)) by multiplying the sequence of symbols 706 with sign bits (e.g., S(0)~S(m−1)) generated as discussed above with reference to the amplitude-to-binary mapping block 430, the channel coding block 440, and the sign extraction block 450. Subsequently, the wireless communication device may generate a communication signal from the modulation symbols for transmission via one or more antennas (e.g., via antennas 1016 with reference to FIG. 10 or antennas 1116 with reference to FIG. 11), for example, by mapping the modulation symbols to subcarriers (e.g., the subcarriers 204) as discussed above with reference to FIG. 3.

In some aspects, when the sequence of bits 704 is long, it may not be practical for the MCDM encoding block 720 to wait for entire sequence of bits 704 to be received before selecting a composition for the sequence of bits 704. To reduce processing latency, the MCDM encoding block 720 can utilize a portion (or subset) of the sequence of bits 704 to select a composition. For instance, the MCDM encoding block 720 may read first N1 bits of the sequence of bits 704, generate a first value d (e.g., dyadic point) based on the N1 bits, and select a composition from the subset of compositions based on the first value d. For instance, the MCDM encoding block 720 may select a sub-interval from the plurality of sub-intervals (e.g., the sub-intervals 820, 822, and 824) where the first value d falls within. In general, the N1 value should be large enough so that a suitable composition can be selected for encoding the sequence of bits 704.

In some aspects, the sequence of bits 704 may correspond to a transport block (TB). The size of a TB can be large (e.g., including thousands of bits). That is, k can be as large as 1000 or more. Accordingly, it may be beneficial to read the beginning N1 bits of the sequence of bits 704 and determine an interval (select a composition) based on the N1 bits. As an example, the DM parameter calculation block 710 may provide 3 compositions, C1, C2, and C3 to the MCDM encoding block 720, where C1 has 64 sequences, C2 has 64 sequences and C3 has 128 sequences. Thus, the total number of sequences is 64+64+128=256. As such, the MCDM encoding block 720 may utilize 8 information bits (e.g., log 2(256)=8) to represent all of the 256 sequences. However, the ratio of C1:C2:C3 is 64:64:128, which may be simplified to 1:1:2. Hence, the MCDM encoding block 720 may initially partition the interval (e.g., the interval 818) between the second value (e.g., the lower border value of the interval 818) and the third value (e.g., the upper border value of the interval 818) based on the simplified ratio (e.g., the ratio 1:1:2). The composition selection block 722 may accurately select a composition from the interval. Similar to deriving of the scaling factor "α" discussed above, the MCDM encoding block 720 may set N1 to $\lceil \log_2(1+1+2) \rceil + \tau$, where τ is based on the precision requirement. In some instances, the parameter τ may be set to τ≥2 to provide a certain difference (a smallest distinguishable difference) between the endpoints of each sub-intervals (e.g., the sub-intervals 820, 822, and 824).

As discussed above, when the arithmetic coding block 726 is realized utilizing a fixed-point or integer implementation to implement finite precision arithmetic coding, it may be desirable to apply the interval scaling block 724 to scale the lower border value and the upper border value of sub-interval corresponding to the selected composition and the N1 input bits prior to performing arithmetic coding. In some instances, it may be desirable to select a scaling factor α that is a power of 2. That is, the scaling factor $\alpha = 2^{N2}$ (e.g., $N2 = \lceil \log_2 n \rceil + \tau$ as discussed above with reference to equation (6)) so that the scaling of the lower and upper border values can be realized utilizing binary left shift(s) to provide efficient processing. The N2 value can be selected based on the modulation symbol distribution of the selected composition and/or the desired precision for the lower and upper border values. In some aspects, the lower and upper border values for the sub-interval associated with the selected composition may be represented by an integer with N1 bits prior to scaling and by an integer with N1+N2 bits after the scaling. It should be noted that while N1 can be computed based on the simplified ratio (e.g., 1:1:2 for the example discussed above), N2 may not be computed based on the simplified ratio, for example, due to the use of CCDM which updates the symbol distribution after every input (for CCDM decoding) or after every output (for CCDM encoding). Hence, N2 is computed based on the total number of symbols n and the parameter τ as shown in equation (6).

Figure 9:
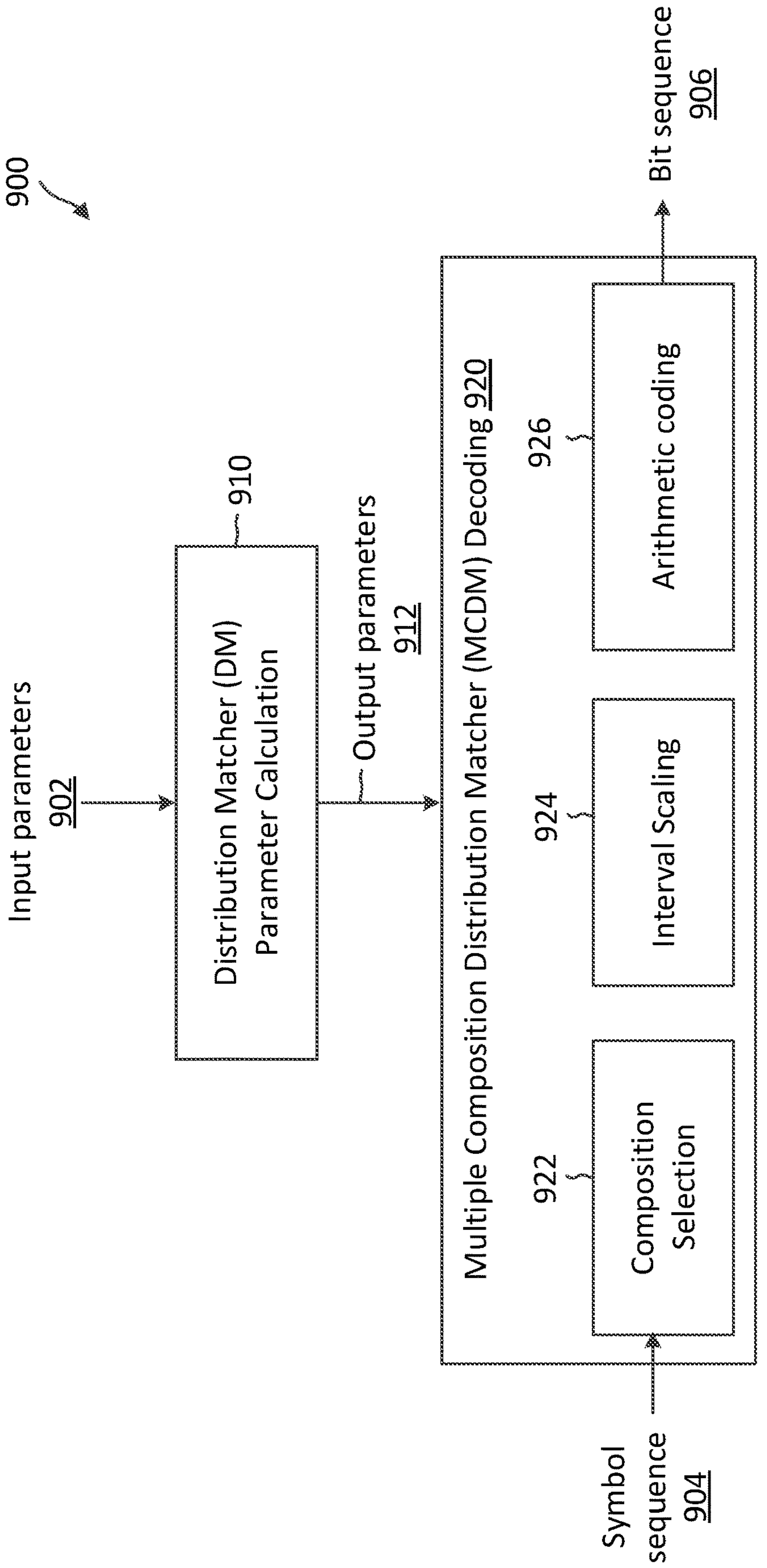
FIG. 9 illustrates an MCDM decoding scheme according to some aspects of the present disclosure.

FIG. 9 illustrates an MCDM decoding scheme 900 according to some aspects of the present disclosure. The scheme 900 may be employed by a wireless communication device such as the BSs 105 and/or the UEs 115 in the network 100 of FIG. 1 or the receiver 318 of FIG. 3. In particular, the wireless communication device may perform MCDM decoding to recover information transmitted by a MCDM-based transmitter as shown in the scheme 900. In some aspects, the MCDM-based transmitter may utilize MCDM encoding mechanisms as discussed above with reference to FIGS. 7 and 8A-8B for the transmission.

For instance, the wireless communication device may include a DM parameter calculation block 910 and an MCDM decoding block 920. The MCDM decoding block 920 may include a composition selection block 922, an interval scaling block 924, and an arithmetic coding block 926. At a high level, the DM parameter calculation block 910 may provide a set of parameters 912 to the MCDM decoding block 920. The set of parameters 912 may be used to configure the MCDM decoding block 920. The MCDM decoding block 920 may receive a sequence of symbols 904 (e.g., obtained from a communication signal received from a transmitter that utilizes MCDM encoding) to recover a sequence of bits 906. The sequence of symbols 904 may have a non-uniform distribution with a certain probability of distribution, and the sequence of output bits 906 may have a more or less uniform distribution.

The DM parameter calculation block 910 may determine a set of output parameters 912 based on a set of input parameters 902 using substantially mechanisms as the DM parameter calculation block 710. The set of input parameters 902 may include a modulation scheme, a number of time-frequency resources, a DM rate, amplitude set of symbols for the modulation scheme. For instance, the DM parameter calculation block 910 may calculate a set of output parameters 912 including at least one of an output bit sequence length k (e.g., a number of bits in the sequence of bits 906) or a set of selected compositions and associated properties. In some aspects, the DM parameter calculation block 910 may compute the input symbol sequence length n based on a MCS used by the transmitter to generate the communication signal and a number of time-frequency resources (e.g., a number of REs 212) used by the transmitter to transmit the communication signal. The MCS may indicate a modulation scheme and a FEC coding rate used by the transmitter. Some examples of the modulation scheme may include 4-QAM, 8-QAM, 16-QAM, 32-QAM, 64-QAM, 128-QAM, 256-QAM, etc. or any other types of modulation scheme. Some examples of FEC coding rate may include ½, ⅓, ⅔, ⅚, ⅞, etc. In some aspects, when the wireless communication device is a BS (e.g., a BS 105), the wireless communication device may schedule the transmitter (e.g., a UE 115) to transmit the communication signal. Accordingly, the wireless communication device may have information about the MCS and the resources used for the communication signal. In other aspects, when the wireless communication device is a UE (e.g., a UE 115), the wireless communication device may receive a DL grant for receiving the communication signal, and the DL grant may indicate the MCS and resources allocated for the communication signal. The wireless communication device may compute the output bit sequence length k based on a DM rate and n, for example, using the relationship shown in equation (1) above.

In some aspects, the DM parameter calculation block 910 may determine a plurality of compositions based on the modulation scheme and select a subset of compositions from the plurality of compositions using similar mechanisms as discussed above with reference to FIGS. 5B, 7, and 8A-8B. For instance, the DM parameter calculation block 910 may determine all the possible combinations or sequences of modulation symbol amplitudes for the sequence of input symbols 904. For example, there may be $2^k$ number of possible combinations of modulation symbol amplitudes as discussed above with reference to FIG. 5B. The DM parameter calculation block 910 may group the combination or sequences with the same symbol distribution (e.g., the same number of occurrences for each symbol in the set of modulation symbols for the modulation scheme) into a composition. The DM parameter calculation block 910 may select a subset of the compositions from the plurality of compositions as discussed above. In some aspects, the selection may be based on at least one of a DM rate associated with the modulation scheme and the error coding rate (e.g., the FEC coding rate), a first number of symbols in the sequence of symbols 904, or amplitudes of the set of modulation symbols associated with the modulation scheme. In some aspects, the selection may be based on certain rules, for example, a MPDM selection rule, a sphere shaping selection rule. In some aspects, the rules can be predetermined or configured by a received configuration. The DM parameter calculation block 910 may indicate, in the output parameters 912, the selected subset of compositions and associated properties (e.g., amplitude modulation symbol distribution) for each composition in the subset.

The MCDM decoding block 920 may perform MCDM decoding based on the set of output parameters 912. For instance, the MCDM decoding block 920 may obtain the sequence of symbols 904 having n number of symbols. In some aspects, the wireless communication device may receive the communication signal, perform channel estimation and demodulation on the received communication signal to obtain the sequence of symbols 904. The composition selection block 922 may select a first composition from the subset of compositions output by the DM parameter calculation block 910. In some aspects, the composition selection block 922 may determine a modulation symbol distribution for the sequence of input symbols 904. In this regard, the composition selection block 922 may count the number of occurrences for each symbol of a set of M symbols (for the modulation scheme) in the sequence of symbols 904 to obtain the modulation symbol distribution for the received sequence of symbols. As an example, the modulation scheme is 16-QAM. The symbol amplitudes (positive amplitudes) for 16-QAM may include {1, 3} as discussed above with reference to FIGS. 5A and 5B. Accordingly, the composition selection block 922 may count the number of symbols (which may be represented as S1) in the sequence of symbols 904 that have values of 1 and the number of symbols (which may be represented as S2) in the sequence of symbols 904 that have values of 3. The modulation symbol distribution for the sequence of symbols 904 is therefore a distribution of {S1, S2}. The composition selection block 922 may select the first composition by comparing the modulation symbol distribution of the sequence of input symbols 904 against the modulation symbol distribution of each composition in the subset of compositions. The composition selection block 922 may select the first composition based on the first composition having a modulation symbol distribution that matches or is closest to the modulation symbol distribution of the sequence of input symbols 904.

The subset of compositions may each correspond to a sub-interval in an interval between 0.0 and 1.0. The composition selection block 922 may provide the upper border value and the lower border value for a sub-interval corresponding to the selected composition to the interval scaling block 924. The composition selection block 922 may also provide the modulation symbol distribution associated with the select composition and the sequence of symbol 904 to the interval scaling block 924. Referring to the example shown in FIG. 8, the plurality of compositions and the subset of compositions determined by the DM parameter calculation block 910 for the modulation scheme may correspond to the compositions 812 (e.g., the compositions 1 to 5) and subset of compositions 814 (e.g., the compositions 1 to 3), respectively. For example, the composition selection block 922 may select the composition 2 based on the modulation symbol distribution of the sequence of input symbols 904 matches or being closest to the modulation symbol distribution of the composition 2. The composition selection block 922 may provide the lower border value $F_p$ and the upper border value $F_{p+1}$ for the sub-interval 822 (corresponding to the composition 2) to the interval scaling block 924.

The interval scaling block 924 may scale the lower border value and the upper border value for the selected composition and the sequence of symbols 904 using substantially mechanisms as the interval scaling block 724. The interval scaling block 924 may take the symbol distribution of the selected composition, the lower border value and the upper border value of the selected composition, and the sequence of input symbols 904 as input and provide a scaled lower border value, a scaled upper border value, and a scaled input bit sequence as output. In some aspects, the interval scaling block 924 may determine a scaling factor, which may be represented as a, based on the symbol distribution in the selected composition and a precision requirement for the upper border value and/or the lower border value. For instance, the interval scaling block 924 may be utilized when the arithmetic coding block 926 is realized using a fixed-point implementation (e.g., integer implementation). That is, the arithmetic coding block 926 performs finite precision arithmetic coding (e.g., arithmetic encoding). Accordingly, in some aspects, the precision requirement may be dependent on the length n of the sequence of symbols 904, for example, as discussed above with reference to equation (6).

The interval scaling block 924 may scale the lower border value and the upper border value of the selected composition by $\alpha$. Thus, the sub-interval (e.g., the sub-interval 822) for the selected composition is scaled to an interval with an inclusive lower border value of $\alpha \times F_p$, and an exclusive upper border value of $\alpha \times F_{p+1}$. The scaled interval may be represented as $\alpha \times [F_p, F_{p+1})$.

Further, the interval scaling block 924 may scale the input symbol sequence 904 by $\alpha \cdot$ (e.g., using binary left shift(s)). The interval scaling block 924 may send the scaled lower border value, the scaled upper border value, and the scaled input bit sequence to the arithmetic coding block 926.

The arithmetic coding block 926 may perform arithmetic coding on the scaled input symbols 904 to recover a sequence of bits 906. As explained above, arithmetic encoding is used for converting symbols to bits. Accordingly, the arithmetic coding block 926 may apply arithmetic encoding techniques to the scaled input symbols 904 to provide the sequence of bits 906, for example, utilizing similar mechanisms as discussed above with reference to FIG. 6. However, the arithmetic coding block 926 may perform the arithmetic encoding beginning with an initial interval between the scaled lower border value (e.g., $\alpha \times F_p$) and the scaled upper border value (e.g., $\alpha \times F_{p+1}$) provided by the interval scaling block 924.

In some aspects, the arithmetic coding block 926 may utilize CCDM decoding to decode the scaled sequence of symbols 904 into the sequence of bits 906. CCDM decoding is substantially similar to the arithmetic coding shown in FIG. 6. CCDM decoding may including performing arithmetic encoding. In some aspects, the interval scaling block 924 may be bypassed. That is, the wireless communication device may not perform interval scaling, and the arithmetic coding block 926 may perform CCDM decoding (based on arithmetic encoding techniques) beginning with the sub-interval $[F_p, F_{p+1})$.

In some aspects, CCDM may include apply adaptive scaling at an intermediate iteration (e.g., the iteration 620 or 630). The interval calculation for CCDM is different from arithmetic coding method because the CCDM takes into account the change in symbol distribution after a CCDM decoder reads each symbol or after a CCDM encoder outputs each symbol. As an example, for an input bit length k and an output symbol length n, where n=100 and the output symbol sequence includes 16-QAM symbols with 70 amplitude values of 1 and 30 amplitude values of 3, and the symbol sequence includes {1, 3, 3, . . . }. At an initial iteration (a first iteration), the ratio of interval for amplitude values "1" amplitude values "3"=70/30. After the wireless communication device read the first symbol "1" of the symbol sequence, the wireless communication device may update the upper border and the lower border based on the symbol distribution of 70/30. At a next iteration (a second iteration), the wireless communication device reads the next symbol "3" from the symbol sequence. The wireless communication device may update the interval based on the updated symbol distribution of 69/30 (because the wireless communication device read the first symbol "1" in the first iteration). At a next iteration (a third iteration), the wireless communication device reads the third symbol "3" from the symbol sequence. The wireless communication device may update the interval based on the symbol distribution of 69/29 (because the wireless communication device read the second symbol "3" in the second iteration), and so on. In general, the wireless communication device may update the symbol distribution every time after the wireless communication device outputs (CCDM encoder) or inputs (CCDM decoder) a symbol for further interval updating.

While FIG. 9 illustrates the interval scaling block 924 as a separate block from the composition selection block 922 and the arithmetic coding block 926, aspects are not limited thereto. To that end, the interval scaling block 924 may be implemented as part of the composition selection block 922. For instance, the composition selection block 922 may select the composition, apply a scaling factor to the lower border value and the upper border value for the selected composition, and provide the scaled lower border value and the scaled upper border value to the arithmetic coding block 926. Alternatively, the interval scaling block 924 may be implemented as part of the arithmetic coding block 926. For instance, the arithmetic coding block 926 may receive the lower border value and the upper border value for the selected composition and may apply a scaling factor to the lower border value and the upper border value of a sub-interval before beginning the decoding.

In some aspects, when the arithmetic coding block 926 utilizes a fixed-point or integer implementation to implement finite precision arithmetic coding (arithmetic encoding), it may be desirable to apply the interval scaling block 924 to scale the lower border value and the upper border value of sub-interval corresponding to the selected composition prior to performing arithmetic coding. In some instances, it may be desirable to select a scaling factor α that is a power of 2 (e.g., $2^{N2}$) so that the scaling of the lower and upper border values can be realized utilizing binary left shift(s) to provide efficient processing. The N2 value can be selected based on the modulation symbol distribution of the selected composition and/or the desired precision for the lower and upper border values. In some aspects, the lower and upper border values for the sub-interval associated with the selected composition may be represented by an integer with N1 bits prior to scaling and by an integer with N1+N2 bits after the scaling.

In some aspects, a transmitter may implement MCDM encoding utilizing the schemes 700 as discussed above with reference to FIG. 7 and a corresponding or peer receiver may implement MCDM decoding utilizing the schemes 900 as discussed above with reference to FIG. 9. The transmitter and the receiver may utilize the same rules to compute the DM parameters (e.g., DM rate) for MCDM encoding/decoding so that the DM parameters are consistent between the transmitter and the receiver. In general, the DM rate, the MCS, and the symbol length may be the same at the transmitter and at the receiver. In some instances, the transmitter may be one of a BS 105 or a UE 115, and the receiver may be the other one of the BS 105 or the UE 115, and the DM parameters may be provided by the BS 105.

Figure 10:
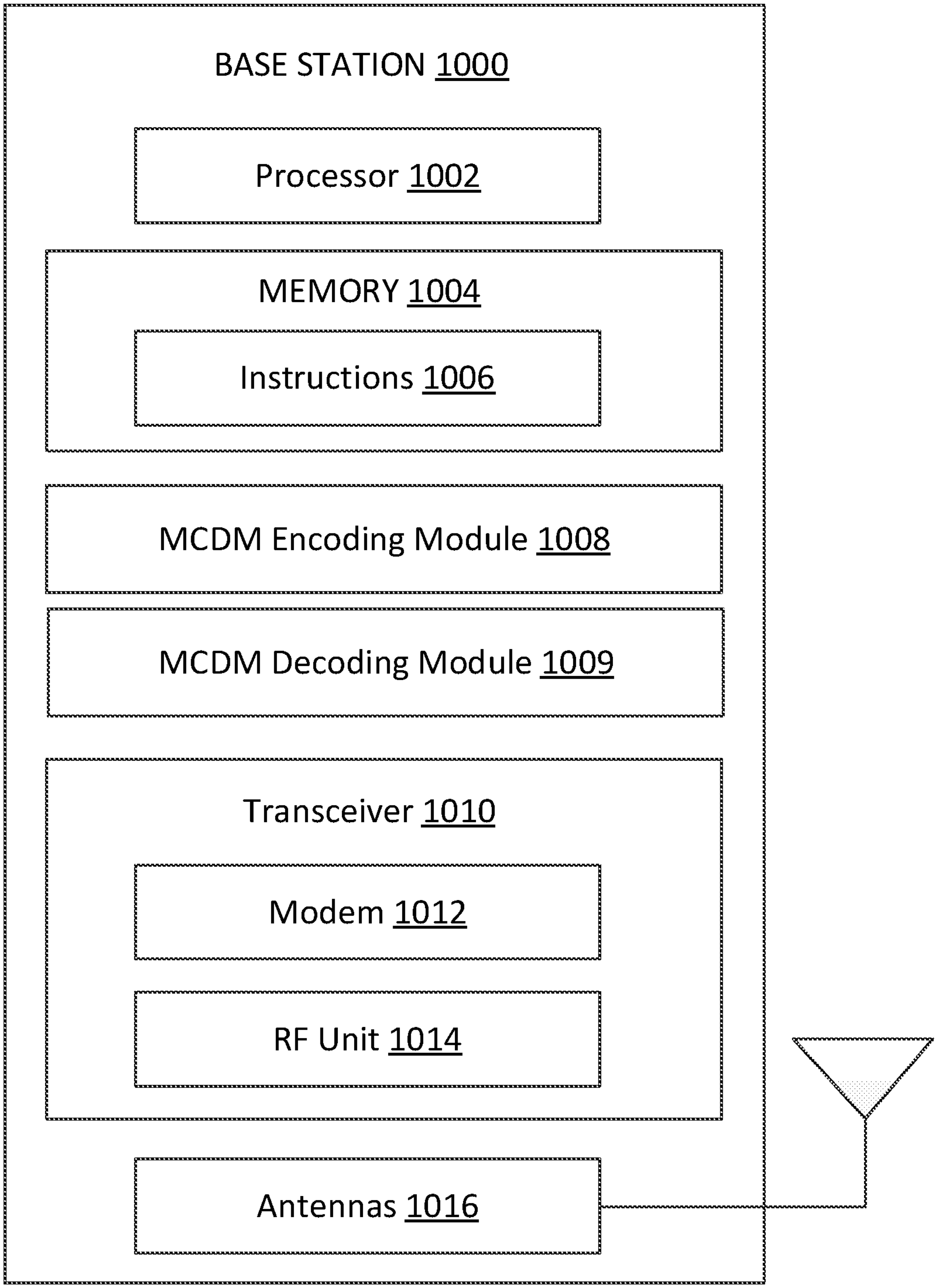
FIG. 10 illustrates a block diagram of a base station (BS) according to some aspects of the present disclosure.

FIG. 10 is a block diagram of an exemplary BS 1000 according to some aspects of the present disclosure. The BS 1000 may be a BS 105 as discussed in FIGS. 1-4, 5A-5B, 6-7, 8A-8B, 9, and 12-13. A shown, the BS 1000 may include a processor 1002, a memory 1004, a MCDM encoding module 1008, a MCDM decoding module 1009, a transceiver 1010 including a modem subsystem 1012 and a RF unit 1014, and one or more antennas 1016. These elements may be coupled with one another. The term "coupled" may refer to directly or indirectly coupled or connected to one or more intervening elements. For instance, these elements may be in direct or indirect communication with each other, for example via one or more buses.

The processor 1002 may have various features as a specific-type processor. For example, these may include a CPU, a DSP, an ASIC, a controller, a FPGA device, another hardware device, a firmware device, or any combination thereof configured to perform the operations described herein. The processor 1002 may also be implemented as a combination of computing devices, e.g., a combination of a DSP and a microprocessor, a plurality of microprocessors, one or more microprocessors in conjunction with a DSP core, or any other such configuration.

The memory 1004 may include a cache memory (e.g., a cache memory of the processor 1002), RAM, MRAM, ROM, PROM, EPROM, EEPROM, flash memory, a solid state memory device, one or more hard disk drives, memristor-based arrays, other forms of volatile and non-volatile memory, or a combination of different types of memory. In some aspects, the memory 1004 may include a non-transitory computer-readable medium. The memory 1004 may store instructions 1006. The instructions 1006 may include instructions that, when executed by the processor 1002, cause the processor 1002 to perform operations described herein, for example, aspects of FIGS. 11-4, 5A-5B, 6-7, 8A-8B, 9, and 12-13. Instructions 1006 may also be referred to as program code. The program code may be for causing a wireless communication device to perform these operations, for example by causing one or more processors (such as processor 1002) to control or command the wireless communication device to do so. The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may include a single computer-readable statement or many computer-readable statements.

Each of the MCDM encoding module 1008 and the MCDM decoding module 1009 may be implemented via hardware, software, or combinations thereof. For example, each of the MCDM encoding module 1008 and the MCDM decoding module 1009 may be implemented as a processor, circuit, and/or instructions 1006 stored in the memory 1004 and executed by the processor 1002. In some examples, the MCDM encoding module 1008 and the MCDM decoding module 1009 can be integrated within the modem subsystem 1012. For example, the MCDM encoding module 1008 and the MCDM decoding module 1009 can be implemented by a combination of software components (e.g., executed by a DSP or a general processor) and hardware components (e.g., logic gates and circuitry) within the modem subsystem 1012. The MCDM encoding module 1008 and the MCDM decoding module 1009 may communicate with one or more components of BS 1000 to implement various aspects of the present disclosure, for example, aspects of FIGS. 1-4, 5A-5B, 6-7, 8A-8B, 9, and 12-13.

In some aspects, the MCDM encoding module 1008 may be substantially similar to the MCDM encoding block 720 discussed above with reference to FIG. 7. For instance, the MCDM encoding module 1008 is configured to select a first composition from a plurality of compositions (e.g., the compositions 520, 522, 524, 526, 528, 812, and/or 814) based on a first value representing a sequence of bits, where each composition of the plurality of compositions comprises a different modulation symbol distribution associated with the modulation scheme. The MCDM encoding module 1008 is further configured to encode, based on the first composition, the sequence of bits into a sequence of symbols using arithmetic coding (e.g., arithmetic decoding or CCDM encoding). The MCDM encoding module 1008 is further configured to transmit a communication signal including the sequence of symbols.

In some aspects, the MCDM encoding module 1008 is further configured to determine the plurality of compositions, for example, using mechanisms as discussed above with reference to FIG. 5B. In some aspects, as part of selecting the first composition, the MCDM encoding module 1008 is further configured to select a subset of compositions from the plurality of compositions and select the first compositions from the subset of compositions based on the first value, for example, using mechanisms as discussed above with reference to FIGS. 7 and 8A-8B. In some aspects, each composition of the subset of compositions may correspond to a different one of a plurality of sub intervals (e.g., the sub-intervals 820, 822, 824) in an interval between a second value (e.g., 0.0) and a third value (e.g., 1.0), and the MCDM encoding module 1008 is further configured to perform the encoding beginning with an initial interval between a fourth value (e.g., an inclusive lower border value $F_p$) and a fifth value (e.g., an exclusive upper border value $F_{p+1}$). In some aspects, the MCDM encoding module 1008 is further configured to scale the fourth value and the fifth value by a scaling factor before performing the arithmetic coding.

In some aspects, the MCDM decoding module 1009 may be substantially similar to the MCDM decoding block 920 discussed above with reference to FIG. 9. For instance, the MCDM decoding module 1009 is configured to select, based on a sequence of symbols associated with a modulation scheme, a first composition from a plurality of compositions (e.g., the compositions 520, 522, 524, 526, 528, 812, and/or 814) associated with the modulation scheme, where each composition of the plurality of compositions comprises a different modulation symbol distribution associated with the modulation scheme. The MCDM decoding module 1009 is further configured to decode, based on the first composition, the sequence of symbols using arithmetic coding (e.g., arithmetic encoding or CCDM decoding) to obtain a sequence of bits.

In some aspects, as part of selecting the first composition, the MCDM decoding module 1009 is further configured to select a subset of compositions from the plurality of compositions and select the first composition from the subset of compositions based on the sequence of symbols and select the first compositions from the subset of compositions based on a modulation symbol distribution associated with the sequence of symbols and a modulation symbol distribution associated with the first composition, for example, using mechanisms as discussed above with reference to FIG. 9. In some aspects, each composition of the subset of compositions may correspond to a different one of a plurality of sub intervals (e.g., the sub-intervals 820, 822, 824) in an interval between a first value (e.g., 0.0) and a second value (e.g., 1.0), and the MCDM decoding module 1009 is further configured to perform the decoding beginning with an initial interval between a third value (e.g., an inclusive lower border value $F_p$) and a fourth value (e.g., an exclusive upper border value $F_{p+1}$). In some aspects, the MCDM decoding module 1009 is further configured to scale the third value and the fourth value by a scaling factor before performing the arithmetic coding.

As shown, the transceiver 1010 may include the modem subsystem 1012 and the RF unit 1014. The transceiver 1010 can be configured to communicate bi-directionally with other devices, such as the UEs 115 and/or another core network element. The modem subsystem 1012 may be configured to modulate and/or encode data according to a MCS, e.g., a LDPC coding scheme, a turbo coding scheme, a convolutional coding scheme, a digital beamforming scheme, etc. The RF unit 1014 may be configured to process (e.g., perform analog to digital conversion or digital to analog conversion, etc.) modulated/encoded data (e.g., RRC configuration, PDCCH signals, PDSCH signals, MCDM encoded signals, etc.) from the modem subsystem 1012 (on outbound transmissions) or of transmissions originating from another source such as a UE 115 and/or UE 1100. The RF unit 1014 may be further configured to perform analog beamforming in conjunction with the digital beamforming. Although shown as integrated together in transceiver 1010, the modem subsystem 1012 and/or the RF unit 1014 may be separate devices that are coupled together at the BS 1000 to enable the BS 1000 to communicate with other devices.

The RF unit 1014 may provide the modulated and/or processed data, e.g. data packets (or, more generally, data messages that may contain one or more data packets and other information), to the antennas 1016 for transmission to one or more other devices. The antennas 1016 may further receive data messages transmitted from other devices and provide the received data messages for processing and/or demodulation at the transceiver 1010. The transceiver 1010 may provide the demodulated and decoded data (e.g., PUSCH signal, PUCCH signal, MCDM encoded signal, etc.) to the MCDM encoding module 1008 and MCDM decoding module 1009 for processing. The antennas 1016 may include multiple antennas of similar or different designs in order to sustain multiple transmission links.

In an aspect, the BS 1000 can include multiple transceivers 1010 implementing different RATs (e.g., NR and LTE). In an aspect, the BS 1000 can include a single transceiver 1010 implementing multiple RATs (e.g., NR and LTE). In an aspect, the transceiver 1010 can include various components, where different combinations of components can implement different RATs.

In some aspects, the processor 1002 is coupled to the memory 1004, the transceiver 1010, MCDM encoding module 1008, and the MCDM decoding module 1009. In some aspects, the processor 1002 may be implemented as part of the MCDM encoding module 1008 and/or the MCDM decoding module 1009. In some aspects, the processor 1002 is configured to select, based on a first value representing a sequence of bits, a first composition from a plurality of compositions, where each composition of the plurality of compositions comprises a different modulation symbol distribution associated with a modulation scheme. The processor 1002 is further configured to encode, based on the first composition, the sequence of bits into a sequence of symbols using arithmetic coding. The processor 1002 is further configured to transmit a communication signal including the sequence of symbols. In some aspects, the processor 1002 is configured to select, based on a sequence of symbols associated with a modulation scheme, a first composition from a plurality of compositions, where each composition of the plurality of compositions comprises a different modulation symbol distribution associated with the modulation scheme. The processor 1002 is further configured to decode, based on the first composition, the sequence of symbols using arithmetic coding to obtain a sequence of bits.

Figure 11:
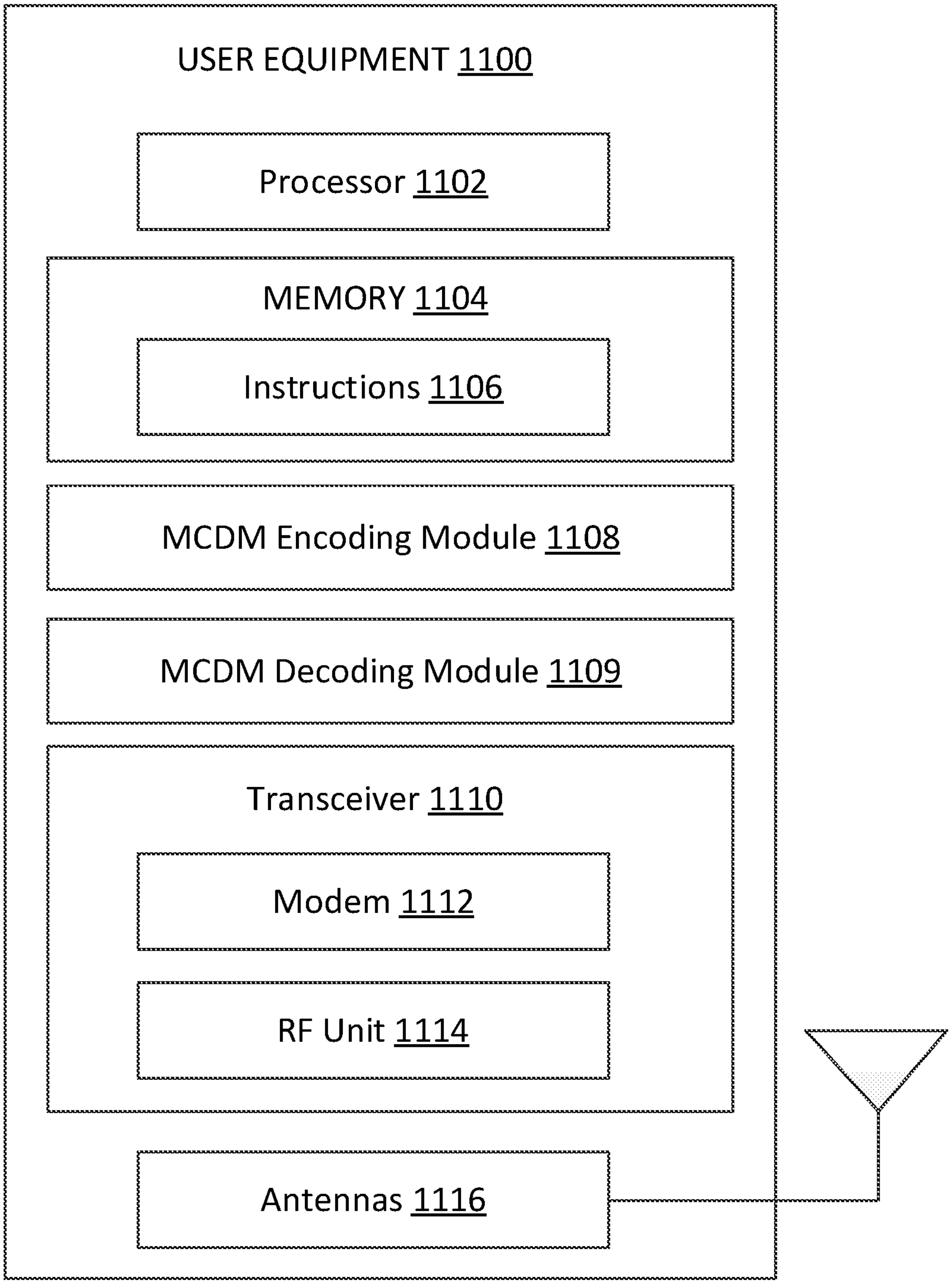
FIG. 11 illustrates a block diagram of a user equipment (UE) according to some aspects of the present disclosure.

FIG. 11 is a block diagram of an exemplary UE 1100 according to some aspects of the present disclosure. The UE 1100 may be a UE 115 as discussed above in FIGS. 1-4, 5A-5B, 6-7, 8A-8B, 9, and 12-13. As shown, the UE 1100 may include a processor 1102, a memory 1104, a MCDM encoding module 1108, a MCDM decoding module 1109, a transceiver 1110 including a modem subsystem 1112 and a radio frequency (RF) unit 1114, and one or more antennas 1116. These elements may be coupled with one another. The term "coupled" may refer to directly or indirectly coupled or connected to one or more intervening elements. For instance, these elements may be in direct or indirect communication with each other, for example via one or more buses.

The processor 1102 may include a central processing unit (CPU), a digital signal processor (DSP), an application specific integrated circuit (ASIC), a controller, a field programmable gate array (FPGA) device, another hardware device, a firmware device, or any combination thereof configured to perform the operations described herein. The processor 1102 may also be implemented as a combination of computing devices, e.g., a combination of a DSP and a microprocessor, a plurality of microprocessors, one or more microprocessors in conjunction with a DSP core, or any other such configuration.

The memory 1104 may include a cache memory (e.g., a cache memory of the processor 1102), random access memory (RAM), magnetoresistive RAM (MRAM), read-only memory (ROM), programmable read-only memory (PROM), erasable programmable read only memory (EPROM), electrically erasable programmable read only memory (EEPROM), flash memory, solid state memory device, hard disk drives, other forms of volatile and non-volatile memory, or a combination of different types of memory. In an aspect, the memory 1104 includes a non-transitory computer-readable medium. The memory 1104 may store, or have recorded thereon, instructions 1106. The instructions 1106 may include instructions that, when executed by the processor 1102, cause the processor 1102 to perform the operations described herein with reference to a UE 115 or an anchor in connection with aspects of the present disclosure, for example, aspects of FIGS. -4, 5A-5B, 6-7, 8A-8B, 9, and 12-13. Instructions 1106 may also be referred to as code, which may be interpreted broadly to include any type of computer-readable statement(s) as discussed above with respect to FIG. 10.

Each of the MCDM encoding module 1108 and the MCDM decoding module 1109 may be implemented via hardware, software, or combinations thereof. For example, each of the MCDM encoding module 1108 and the MCDM decoding module 1109 may be implemented as a processor, circuit, and/or instructions 1106 stored in the memory 1104 and executed by the processor 1102. In some aspects, the MCDM encoding module 1108 and the MCDM decoding module 1109 can be integrated within the modem subsystem 1112. For example, the MCDM encoding module 1108 and the MCDM decoding module 1109 can be implemented by a combination of software components (e.g., executed by a DSP or a general processor) and hardware components (e.g., logic gates and circuitry) within the modem subsystem 1112. The MCDM encoding module 1108 and the MCDM decoding module 1109 may communicate with one or more components of wireless communication UE 1100 to implement various aspects of the present disclosure, for example, aspects of FIGS. 1-4, 5A-5B, 6, 7A-7C, 8A-8B, and 9.

In some aspects, the MCDM encoding module 1108 may be substantially similar to the MCDM encoding block 720 discussed above with reference to FIG. 7. For instance, the MCDM encoding module 1108 is configured to select a first composition from a plurality of compositions (e.g., the compositions 520, 522, 524, 526, 528, 812, and/or 814) based on a first value representing a sequence of bits, where each composition of the plurality of compositions comprises a different modulation symbol distribution associated with the modulation scheme. The MCDM encoding module 1108 is further configured to encode, based on the first composition, the sequence of bits into a sequence of symbols using arithmetic coding (e.g., arithmetic decoding or CCDM encoding). The MCDM encoding module 1108 is further configured to transmit a communication signal including the sequence of symbols.

In some aspects, the MCDM encoding module 1108 is further configured to determine the plurality of compositions, for example, using mechanisms as discussed above with reference to FIG. 5B. In some aspects, as part of selecting the first composition, the MCDM encoding module 1108 is further configured to select a subset of compositions from the plurality of compositions and select the first compositions from the subset of compositions based on the first value, for example, using mechanisms as discussed above with reference to FIGS. 7 and 8A-8B. In some aspects, each composition of the subset of compositions may correspond to a different one of a plurality of sub intervals (e.g., the sub-intervals 820, 822, 824) in an interval between a second value (e.g., 0.0) and a third value (e.g., 1.0), and the MCDM encoding module 1108 is further configured to perform the encoding beginning with an initial interval between a fourth value (e.g., an inclusive lower border value $F_p$) and a fifth value (e.g., an exclusive upper border value $F_{p+1}$). In some aspects, the MCDM encoding module 1108 is further configured to scale the fourth value and the fifth value by a scaling factor before performing the arithmetic coding.

In some aspects, the MCDM decoding module 1109 may be substantially similar to the MCDM decoding block 920 discussed above with reference to FIG. 9. For instance, the MCDM decoding module 1109 is configured to select, based on a sequence of symbols associated with a modulation scheme, a first composition from a plurality of compositions (e.g., the compositions 520, 522, 524, 526, 528, 812, and/or 814) associated with the modulation scheme, where each composition of the plurality of compositions comprises a different modulation symbol distribution associated with the modulation scheme. The MCDM decoding module 1109 is further configured to decode, based on the first composition, the sequence of symbols using arithmetic coding (e.g., arithmetic encoding or CCDM decoding) to obtain a sequence of bits.

In some aspects, as part of selecting the first composition, the MCDM decoding module 1109 is further configured to select a subset of compositions from the plurality of compositions and select the first composition from the subset of compositions based on the sequence of symbols and select the first compositions from the subset of compositions based on a modulation symbol distribution associated with the sequence of symbols and a modulation symbol distribution associated with the first composition, for example, using mechanisms as discussed above with reference to FIG. 9. In some aspects, each composition of the subset of compositions may correspond to a different one of a plurality of sub intervals (e.g., the sub-intervals 820, 822, 824) in an interval between a first value (e.g., 0.0) and a second value (e.g., 1.0), and the MCDM decoding module 1109 is further configured to perform the decoding beginning with an initial interval between a third value (e.g., an inclusive lower border value $F_p$) and a fourth value (e.g., an exclusive upper border value $F_{p+1}$). In some aspects, the MCDM decoding module 1109 is further configured to scale the third value and the fourth value by a scaling factor before performing the arithmetic coding.

As shown, the transceiver 1110 may include the modem subsystem 1112 and the RF unit 1114. The transceiver 1110 can be configured to communicate bi-directionally with other devices, such as the BSs 105 and 1000. The modem subsystem 1112 may be configured to modulate and/or encode the data from the memory 1104 and/or the MCDM encoding module 1108, the MCDM decoding module 1109 according to a modulation and coding scheme (MCS), e.g., a low-density parity check (LDPC) coding scheme, a turbo coding scheme, a convolutional coding scheme, a digital beamforming scheme, etc. The RF unit 1114 may be configured to process (e.g., perform analog to digital conversion or digital to analog conversion, etc.) modulated/encoded data (e.g., PUSCH signal, PUCCH signal, MCDM encoded signal, etc.) from the modem subsystem 1112 (on outbound transmissions) or of transmissions originating from another source such as a UE 115, a BS 105, or an anchor. The RF unit 1114 may be further configured to perform analog beamforming in conjunction with the digital beamforming. Although shown as integrated together in transceiver 1110, the modem subsystem 1112 and the RF unit 1114 may be separate devices that are coupled together at the UE 115 to enable the UE 115 to communicate with other devices.

The RF unit 1114 may provide the modulated and/or processed data, e.g. data packets (or, more generally, data messages that may contain one or more data packets and other information), to the antennas 1116 for transmission to one or more other devices. The antennas 1116 may further receive data messages transmitted from other devices. The antennas 1116 may provide the received data messages for processing and/or demodulation at the transceiver 1110. The transceiver 1110 may provide the demodulated and decoded data (e.g., RRC configuration, PDCCH signals, PDSCH signals, MCDM encoded signals, etc.) to the MCDM encoding module 1108 and the MCDM decoding module 1109 for processing. The antennas 1116 may include multiple antennas of similar or different designs in order to sustain multiple transmission links.

In an aspect, the UE 1100 can include multiple transceivers 1110 implementing different RATs (e.g., NR and LTE). In an aspect, the UE 1100 can include a single transceiver 1110 implementing multiple RATs (e.g., NR and LTE). In an aspect, the transceiver 1110 can include various components, where different combinations of components can implement different RATs.

In some aspects, the processor 1102 is coupled to the memory 1104, the transceiver 1110, MCDM encoding module 1108, and the MCDM decoding module 1109. In some aspects, the processor 1102 may be implemented as part of the MCDM encoding module 1108 and/or the MCDM decoding module 1109. In some aspects, the processor 1102 is configured to select, based on a first value representing a sequence of bits, a first composition from a plurality of compositions, where each composition of the plurality of compositions comprises a different modulation symbol distribution associated with a modulation scheme. The processor 1102 is further configured to encode, based on the first composition, the sequence of bits into a sequence of symbols using arithmetic coding. The processor 1102 is further configured to transmit, via the transceiver 1110, a communication signal including the sequence of symbols. In some aspects, the processor 1102 is configured to select, based on a sequence of symbols associated with a modulation scheme, a first composition from a plurality of compositions, where each composition of the plurality of compositions comprises a different modulation symbol distribution associated with the modulation scheme. The processor 1102 is further configured to decode, based on the first composition, the sequence of symbols using arithmetic coding to obtain a sequence of bits.

Figure 12:
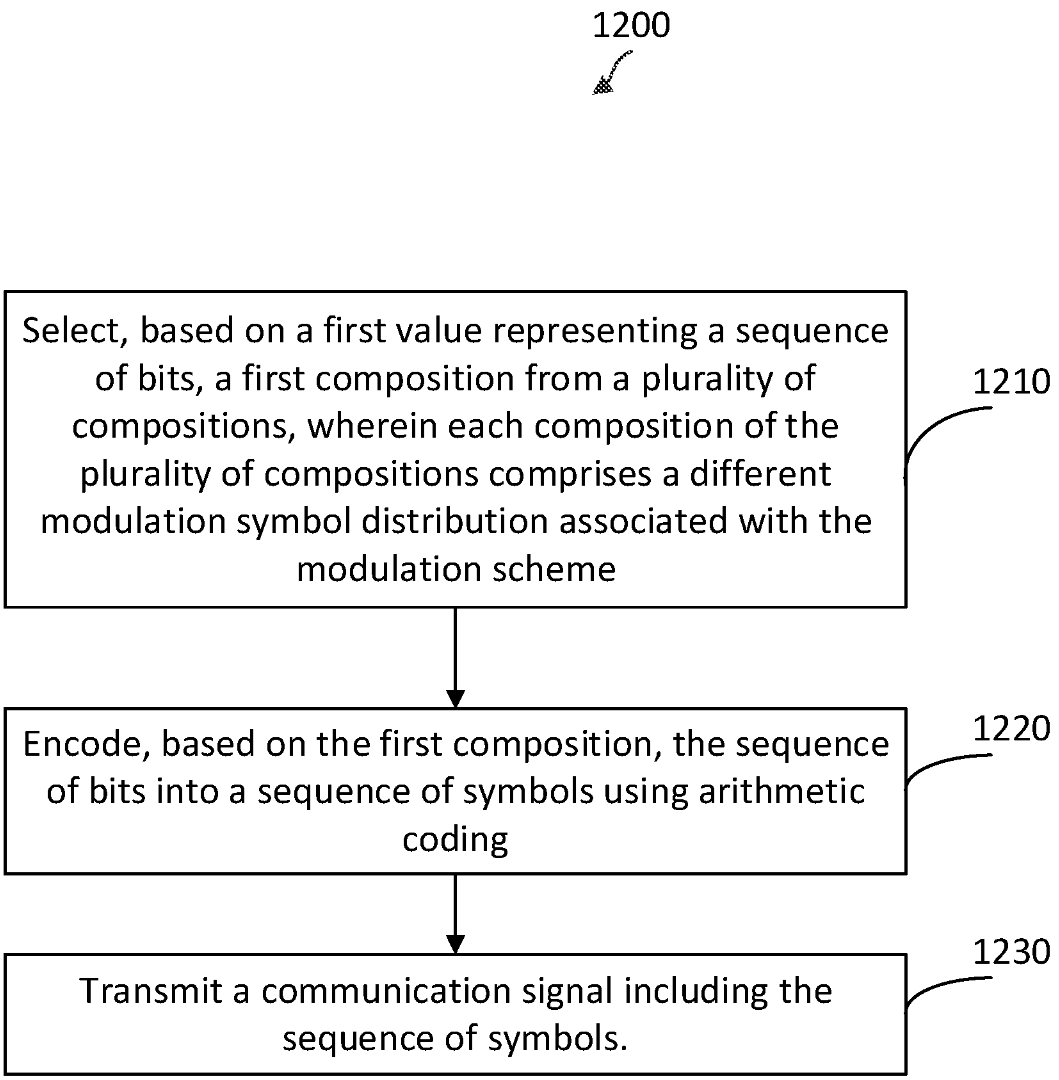
FIG. 12 is a flow diagram of a wireless communication method according to some aspects of the present disclosure.

FIG. 12 is a flow diagram illustrating a wireless communication method 1200 according to some aspects of the present disclosure. Aspects of the method 1200 can be executed by a computing device (e.g., a processor, processing circuit, and/or other suitable component) of a wireless communication device or other suitable means for performing the blocks. In some aspects, a wireless communication device, such as the BS 105 or the BS 1000, may utilize one or more components, such as the processor 1002, the memory 1004, the MCDM encoding module 1008, the MCDM decoding module 1009, the transceiver 1010, the modem 1012, the RF unit 1014, and the one or more antennas 1016, to execute the blocks of method 1200. In some aspects, a wireless communication device, such as the UE 115 or the UE 1100, may utilize one or more components, such as the processor 1102, the memory 1104, the MCDM encoding module 1108, the MCDM decoding module 1109, the transceiver 1110, the modem 1112, the RF unit 1114, and the one or more antennas 1116, to execute the blocks of method 1200. The method 1200 may employ similar mechanisms as described in FIGS. 1-4, 5A-5B, 6-7, and 8A-8B. As illustrated, the method 1200 includes a number of enumerated blocks, but aspects of the method 1200 may include additional blocks before, after, and in between the enumerated blocks. In some aspects, one or more of the enumerated blocks may be omitted or performed in a different order.

At block 1210, a wireless communication device (e.g., a BS 105 or 1000, a UE 115 or 1100, or a transmitter 302) selects, based on a first value representing a sequence of bits, a first composition from a plurality of compositions (e.g., the compositions 520, 522, 524, 526, 528, 812, and/or 814).

Each composition of the plurality of compositions comprises a different modulation symbol distribution associated with the modulation scheme. In some aspects, the wireless communication device may generate the first value from the sequence of bits. The sequence of bits may be information data bits. In some instances, the wireless communication device may apply a binary-to-decimal conversion to the sequence of bits to generate the first value. In some aspects, the first value is a dyadic point (e.g., greater than or equal to 0 and less than 1).

In some aspects, as part of selecting the first composition at block 1210, the wireless communication device may select a subset of compositions from the plurality of compositions and select the first composition from the subset of compositions based on the first value, where each composition of the subset of compositions may correspond to a different one of a plurality of sub intervals (e.g., the sub-intervals 820, 822, 824) in an interval between a second value (e.g., 0.0) and a third value (e.g., 1.0). In some aspects, the plurality of compositions and the subset of compositions may correspond to the plurality of compositions 812 and the subset of compositions 814, respectively, as discussed above with reference to FIG. 8B. In some aspects, the wireless communication device may select the subset of compositions based on at least one of a DM rate associated with the modulation scheme and an error coding rate (e.g., a FEC coding rate), a first number of symbols in the sequence of symbols, or amplitudes of a set of modulation symbols associated with the modulation scheme. In some aspects, the wireless communication device may select the first composition based on the first value being within a first sub-interval of the plurality of sub-intervals, where the first sub-interval corresponds to the first composition. In some aspects, means for performing the functionality of block 1210 can, but not necessarily, include, for example, the processor 1002, the memory 1004, the MCDM encoding module 1008, the transceiver 1010, the modem 1012, the RF unit 1014, and the one or more antennas 1016 with reference to FIG. 10. In some aspects, means for performing the functionality of block 1210 can, but not necessarily, include, for example, the processor 1102, the memory 1104, the MCDM encoding module 1108, the transceiver 1110, the modem 1112, the RF unit 1114, and the one or more antennas 1116 with reference to FIG. 11.

At block 1220, the wireless communication device encodes, based on the first composition, the sequence of bits into a sequence of symbols using arithmetic coding. In some aspects, as part of encoding the sequence of bits, the wireless communication device may perform the encoding based on the first sub-interval, which may be between a fourth value (e.g., an inclusive lower border value $F_p$) and a fifth value (e.g., an exclusive upper border value $F_{p+1}$). In some aspects, the wireless communication device may further apply a scaling factor to the fourth value associated with the first composition to obtain a sixth value, apply the scaling factor to the fifth value associated with the first composition to obtain a seventh value, and perform the encoding based on an interval (e.g., the scaled first sub-interval) between the fifth value and the sixth value. In some aspects, the scaling factor is based on a modulation symbol distribution associated with the first composition. In some aspects, means for performing the functionality of block 1220 can, but not necessarily, include, for example, the processor 1002, the memory 1004, the MCDM encoding module 1008, the transceiver 1010, the modem 1012, the RF unit 1014, and the one or more antennas 1016 with reference to FIG. 10. In some aspects, means for performing the functionality of block 1220 can, but not necessarily, include, for example, the processor 1102, the memory 1104, the MCDM encoding module 1108, the transceiver 1110, the modem 1112, the RF unit 1114, and the one or more antennas 1116 with reference to FIG. 11.

At block 1230, the wireless communication device transmits a communication signal including the sequence of symbols. For instance, the wireless communication device may generate parity bits based at least in part on the sequence of bits, obtain a sequence of sign bits from the parity bits, multiply the sign bits with the sequence of symbols to generate modulation symbols, and generate the communication signal by mapping the modulation symbols to time-frequency resources for transmission. In some aspects, means for performing the functionality of block 1230 can, but not necessarily, include, for example, the processor 1002, the memory 1004, the MCDM encoding module 1008, the transceiver 1010, the modem 1012, the RF unit 1014, and the one or more antennas 1016 with reference to FIG. 10. In some aspects, means for performing the functionality of block 1230 can, but not necessarily, include, for example, the processor 1102, the memory 1104, the MCDM encoding module 1108, the transceiver 1110, the modem 1112, the RF unit 1114, and the one or more antennas 1116 with reference to FIG. 11.

Figure 13:
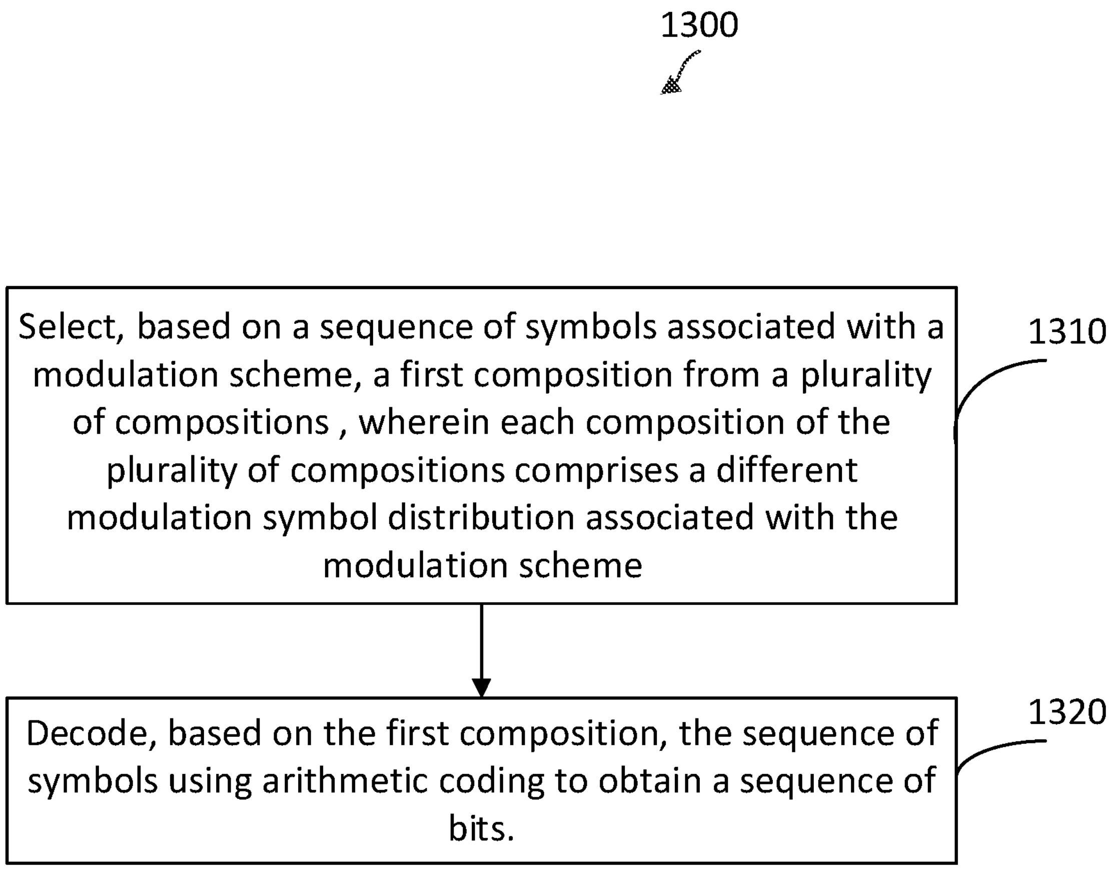
FIG. 13 is a flow diagram of a wireless communication method according to some aspects of the present disclosure.

FIG. 13 is a flow diagram illustrating a wireless communication method 1300 according to some aspects of the present disclosure. Aspects of the method 1300 can be executed by a computing device (e.g., a processor, processing circuit, and/or other suitable component) of a wireless communication device or other suitable means for performing the blocks. In some aspects, a wireless communication device, such as the BS 105 or the BS 1000, may utilize one or more components, such as the processor 1002, the memory 1004, the MCDM encoding module 1008, the MCDM decoding module 1009, the transceiver 1010, the modem 1012, the RF unit 1014, and the one or more antennas 1016, to execute the blocks of method 1300. In some aspects, a wireless communication device, such as the UE 115 or the UE 1100, may utilize one or more components, such as the processor 1102, the memory 1104, the MCDM encoding module 1108, the MCDM decoding module 1109, the transceiver 1110, the modem 1112, the RF unit 1114, and the one or more antennas 1116, to execute the blocks of method 1300. The method 1300 may employ similar mechanisms as described in FIGS. 1-4, 5A-5B, 6, 8A-8B, and 9. As illustrated, the method 1300 includes a number of enumerated blocks, but aspects of the method 1300 may include additional blocks before, after, and in between the enumerated blocks. In some aspects, one or more of the enumerated blocks may be omitted or performed in a different order.

At block 1310, a wireless communication device (e.g., a BS 105 or 1000, a UE 115 or 1100, or a transmitter 302) selects, based on a sequence of symbols associated with a modulation scheme, a first composition from a plurality of compositions (e.g., the compositions 520, 522, 524, 526, 528, 812, and/or 814) associated with the modulation scheme. Each composition of the plurality of compositions comprises a different modulation symbol distribution associated with the modulation scheme.

In some aspects, as part of selecting the first composition at block 1310, the wireless communication device may select a subset of compositions from the plurality of compositions and select the first composition from the subset of compositions based on the sequence of symbols, where each composition of the subset of compositions corresponds to a different one of a plurality of sub intervals (e.g., the sub-intervals 820, 822, 824) in an interval between a first value (e.g., 0.0) and a second value (e.g., 1.0). In some aspects, the plurality of compositions and the subset of compositions may correspond to the plurality of compositions 812 and the subset of compositions 814, respectively, as discussed above with reference to FIG. 8B. In some aspects, the wireless communication device may select the subset of compositions based on at least one of a DM rate associated with the modulation scheme and an error coding rate (e.g., a FEC coding rate), a first number of symbols in the sequence of symbols, or amplitudes of a set of modulation symbols associated with the modulation scheme. In some aspects, as part of selecting the first composition from the subset of compositions, the wireless communication device may select the first composition based on a comparison of a modulation symbol distribution associated with the sequence of symbols to a modulation symbol distribution of the first composition. In some aspects, means for performing the functionality of block 1310 can, but not necessarily, include, for example, the processor 1002, the memory 1004, the MCDM decoding module 1009, the transceiver 1010, the modem 1012, the RF unit 1014, and the one or more antennas 1016 with reference to FIG. 10. In some aspects, means for performing the functionality of block 1310 can, but not necessarily, include, for example, the processor 1102, the memory 1104, the MCDM decoding module 1109, the transceiver 1110, the modem 1112, the RF unit 1114, and the one or more antennas 1116 with reference to FIG. 11.

At block 1320, the wireless communication device decodes, based on the first composition, the sequence of symbols using arithmetic coding to obtain a sequence of bits. In some aspects, the first composition corresponds to a first sub-interval of the plurality of sub-intervals, where first sub-interval is between a third value (e.g., an inclusive lower border value $F_p$) and a fourth value (e.g., an exclusive upper border value $F_{p+1}$). As part of decoding the sequence of symbols, the wireless communication device may perform the decoding based on the first sub-interval between the third value and the fourth value. In some aspects, the wireless communication device may apply a scaling factor to the third value associated with the first composition to obtain a fifth value, apply the scaling factor to the fourth value associated with the first composition to obtain a sixth value, and perform the decoding based on an interval between the fifth value and the sixth value. In some aspects, the scaling factor is based on a symbol distribution associated with the first composition. In some aspects, means for performing the functionality of block 1320 can, but not necessarily, include, for example, the processor 1002, the memory 1004, the MCDM decoding module 1009, the transceiver 1010, the modem 1012, the RF unit 1014, and the one or more antennas 1016 with reference to FIG. 10. In some aspects, means for performing the functionality of block 1320 can, but not necessarily, include, for example, the processor 1102, the memory 1104, the MCDM decoding module 1109, the transceiver 1110, the modem 1112, the RF unit 1114, and the one or more antennas 1116 with reference to FIG. 11.

Further aspects of the present disclosure include the following aspects:

1. A method of wireless communication performed by a wireless communication device, the method comprising:
   - selecting, based on a first value representing a sequence of bits, a first composition from a plurality of compositions, wherein each composition of the plurality of compositions comprises a different modulation symbol distribution associated with a modulation scheme;
   - encoding, based on the first composition, the sequence of bits into a sequence of symbols using arithmetic coding; and
   - transmitting a communication signal including the sequence of symbols.
2. The method of aspect 1, wherein the selecting the first composition comprises:
   - selecting a subset of compositions from the plurality of compositions, wherein each composition of the subset of compositions corresponds to a different one of a plurality of sub-intervals in an interval between a second value and a third value; and
   - selecting the first composition from the subset of compositions based on the first value.
3. The method of any of aspects 1-2, wherein the selecting the subset of compositions from the plurality of compositions is based on at least one of a distribution matcher (DM) rate associated with the modulation scheme and an error coding rate, a first number of symbols in the sequence of symbols, or amplitudes of a set of modulation symbols associated with the modulation scheme.
4. The method of any of aspects 1-3, wherein the selecting the first composition from the subset of compositions comprises:
   - selecting the first composition based on the first value being within a first sub-interval of the plurality of sub-intervals, the first sub-interval corresponding to the first composition.
5. The method of any of aspects 1-4, wherein the first sub-interval is between a fourth value and a fifth value, and wherein the encoding the sequence of bits comprises:
   - performing the encoding based on the first sub-interval between the fourth value and the fifth value.
6. The method of any of aspects 1-5, wherein the first value representing the sequence of bits is greater than or equal to 0 and less than 1, and wherein the second value associated with the subset of compositions is 0 and the third value associated with the subset of compositions is 1.
7. The method of any of aspects 1-6, further comprising:
   - applying a scaling factor to the fourth value associated with the first composition to obtain a sixth value; and
   - applying the scaling factor to the fifth value associated with the first composition to obtain a seventh value,
   - wherein the encoding the sequence of bits comprises:
   - performing the encoding based on an interval between the sixth value and the seventh value.
8. The method of any of aspects 1-7, wherein the scaling factor is based on a modulation symbol distribution associated with the first composition.
9. A method of wireless communication performed by a wireless communication device, the method comprising:
   - selecting, based on a sequence of symbols associated with a modulation scheme, a first composition from a plurality of compositions, wherein each composition of the plurality of compositions comprises a different modulation symbol distribution associated with the modulation scheme; and
   - decoding, based on the first composition, the sequence of symbols using arithmetic coding to obtain a sequence of bits.
10. The method of aspect 9, wherein the selecting the first composition comprises:
    - selecting a subset of compositions from the plurality of compositions, wherein each composition of the subset of compositions corresponds to a different one of a plurality of sub-intervals in an interval between a first value and a second value; and selecting the first composition from the subset of compositions based on the sequence of symbols.

11. The method of any of aspects 9-10, wherein the selecting the subset of compositions from the plurality of compositions is based on at least one of a distribution matcher (DM) rate associated with the modulation scheme and an error coding rate, a first number of bits in the sequence of bits, or amplitudes of a set of modulation symbols associated with the modulation scheme.

12. The method of any of aspects 9-11, wherein the selecting the first composition from the subset of compositions comprises:

selecting the first composition based on a comparison of a modulation symbol distribution associated with the sequence of symbols to a modulation symbol distribution of the first composition.

13. The method of any of aspects 9-12, wherein the first composition corresponds to a first sub-interval of the plurality of sub-intervals, wherein first sub-interval is between a third value and a fourth value, and wherein the decoding the sequence of symbols comprises:

performing the decoding based on the first sub-interval between the third value and the fourth value.

14. The method of any of aspects 9-13, wherein the first value associated with the subset of compositions is 0 and the second value associated with the subset of compositions is 1.

15. The method of any of aspects 9-14, further comprising:

applying a scaling factor to the third value associated with the first composition to obtain a fifth value; and applying the scaling factor to the fourth value associated with the first composition to obtain a sixth value, wherein the decoding the sequence of symbols further comprises:

performing the decoding based on an interval between the fifth value and the sixth value.

16. The method of any of aspects 9-15, wherein the scaling factor is based on a symbol distribution associated with the first composition.

In some aspects, an apparatus includes means for performing the method of any one of aspects 1-8.

In some aspects, a non-transitory computer readable medium includes program code, which when executed by one or more processors, causes a wireless communication device to perform the method of any one of aspects 1-8.

In some aspects, an apparatus includes means for performing the method of any one of aspects 9-16.

In some aspects, a non-transitory computer readable medium includes program code, which when executed by one or more processors, causes a wireless communication device to perform the method of any one of aspects 9-16.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular aspects illustrated and described herein, as they are merely by way of some examples thereof, but rather, should be fully commensurate with that of the claims appended hereafter and their functional equivalents.

What is claimed is:

1. A method of wireless communication performed by a wireless communication device, the method comprising:

selecting, based on a first value representing a sequence of bits, a first composition from a plurality of compositions, wherein each composition of the plurality of compositions comprises a different modulation symbol distribution associated with a modulation scheme;

encoding, based on the first composition, the sequence of bits into a sequence of symbols using arithmetic coding; and transmitting a communication signal including the sequence of symbols, wherein the selecting the first composition comprises:

selecting a subset of compositions from the plurality of compositions, wherein each composition of the subset of compositions corresponds to a different one of a plurality of sub-intervals in an interval between a second value and a third value; and selecting the first composition from the subset of compositions based on the first value.

2. The method of claim 1, wherein the selecting the subset of compositions from the plurality of compositions is based on at least one of a distribution matcher (DM) rate associated with the modulation scheme and an error coding rate, a first number of symbols in the sequence of symbols, or amplitudes of a set of modulation symbols associated with the modulation scheme.

3. The method of claim 1, wherein the selecting the first composition from the subset of compositions comprises:

selecting the first composition based on the first value being within a first sub-interval of the plurality of sub-intervals, the first sub-interval corresponding to the first composition.

4. The method of claim 3, wherein the first sub-interval is between a fourth value and a fifth value, and wherein the encoding the sequence of bits comprises:

performing the encoding based on the first sub-interval between the fourth value and the fifth value.

5. The method of claim 4, wherein the first value representing the sequence of bits is greater than or equal to 0 and less than 1, and wherein the second value associated with the subset of compositions is 0 and the third value associated with the subset of compositions is 1.

6. The method of claim 4, further comprising:

applying a scaling factor to the fourth value associated with the first composition to obtain a sixth value; and applying the scaling factor to the fifth value associated with the first composition to obtain a seventh value, wherein the encoding the sequence of bits comprises:

performing the encoding based on an interval between the sixth value and the seventh value.

7. The method of claim 6, wherein the scaling factor is based on a modulation symbol distribution associated with the first composition.

8. A method of wireless communication performed by a wireless communication device, the method comprising:

selecting, based on a sequence of symbols associated with a modulation scheme, a first composition from a plurality of compositions, wherein each composition of the plurality of compositions comprises a different modulation symbol distribution associated with the modulation scheme; and decoding, based on the first composition, the sequence of symbols using arithmetic coding to obtain a sequence of bits, wherein the selecting the first composition comprises:

selecting a subset of compositions from the plurality of compositions, wherein each composition of the subset of compositions corresponds to a different one of a plurality of sub-intervals in an interval between a first value and a second value; and selecting the first composition from the subset of compositions based on the sequence of symbols.

9. The method of claim 8, wherein the selecting the subset of compositions from the plurality of compositions is based on at least one of a distribution matcher (DM) rate associated with the modulation scheme and an error coding rate, a first number of bits in the sequence of bits, or amplitudes of a set of modulation symbols associated with the modulation scheme.

10. The method of claim 8, wherein the selecting the first composition from the subset of compositions comprises:

selecting the first composition based on a comparison of a modulation symbol distribution associated with the sequence of symbols to a modulation symbol distribution of the first composition.

11. The method of claim 10, wherein the first composition corresponds to a first sub-interval of the plurality of sub-intervals, wherein first sub-interval is between a third value and a fourth value, and wherein the decoding the sequence of symbols comprises:

performing the decoding based on the first sub-interval between the third value and the fourth value.

12. The method of claim 11, wherein the first value associated with the subset of compositions is 0 and the second value associated with the subset of compositions is 1.

13. The method of claim 11, further comprising:

applying a scaling factor to the third value associated with the first composition to obtain a fifth value; and applying the scaling factor to the fourth value associated with the first composition to obtain a sixth value, wherein the decoding the sequence of symbols further comprises:

performing the decoding based on an interval between the fifth value and the sixth value.

14. The method of claim 13, wherein the scaling factor is based on a symbol distribution associated with the first composition.

15. A wireless communication device comprising:

a memory;

a transceiver; and at least one processor coupled to the memory and the transceiver, wherein the at least one processor is configured to:

select, based on a first value representing a sequence of bits, a first composition from a plurality of compositions, wherein each composition of the plurality of compositions comprises a different modulation symbol distribution associated with a modulation scheme;

encode, based on the first composition, the sequence of bits into a sequence of symbols using arithmetic coding; and transmit, via the transceiver, a communication signal including the sequence of symbols, wherein, to select the first composition, the at least one processor is configured to:

select a subset of compositions from the plurality of compositions, wherein each composition of the subset of compositions corresponds to a different one of a plurality of sub-intervals in an interval between a second value and a third value; and select the first composition from the subset of compositions based on the first value.

16. The wireless communication device of claim 15, wherein, to select the subset of compositions from the plurality of compositions, the at least one processor is configured to:

select the subset of compositions from the plurality of compositions based on at least one of a distribution matcher (DM) rate associated with the modulation scheme and an error coding rate, a first number of symbols in the sequence of symbols, or amplitudes of a set of modulation symbols associated with the modulation scheme.

17. The wireless communication device of claim 15, wherein, to select the first composition from the subset of compositions, the at least one processor is configured to:

select the first composition based on the first value being within a first sub-interval of the plurality of sub-intervals, the first sub-interval corresponding to the first composition.

18. The wireless communication device of claim 17, wherein the first sub-interval is between a fourth value and a fifth value, and wherein, to encode the sequence of bits, the at least one processor is configured to:

encode the sequence of bits based on the first sub-interval between the fourth value and the fifth value.

19. The wireless communication device of claim 18, wherein the at least one processor is further configured to:

apply a scaling factor to the fourth value associated with the first composition to obtain a sixth value; and apply the scaling factor to the fifth value associated with the first composition to obtain a seventh value, wherein, to encode the sequence of bits the at least one processor is configured to:

encode the sequence of bits based on an interval between the sixth value and the seventh value.

20. The wireless communication device of claim 19, wherein the scaling factor is based on a modulation symbol distribution associated with the first composition.

21. A wireless communication device comprising:

a memory; and at least one processor coupled to the memory, wherein the at least one processor is configured to:

select, based on a sequence of symbols associated with a modulation scheme, a first composition from a plurality of compositions, wherein each composition of the plurality of compositions comprises a different modulation symbol distribution associated with the modulation scheme; and decode, based on the first composition, the sequence of symbols using arithmetic coding to obtain a sequence of bits, wherein, to select the first composition, the at least one processor is configured to:

select a subset of compositions from the plurality of compositions, wherein each composition of the subset of compositions corresponds to a different one of a plurality of sub-intervals in an interval between a first value and a second value; and select the first composition from the subset of compositions based on the sequence of symbols.

22. The wireless communication device of claim 21, wherein the at least one processor configured to select the subset of compositions from the plurality of compositions is configured to:

select the subset of compositions from the plurality of compositions based on at least one of a distribution matcher (DM) rate associated with the modulation scheme and an error coding rate, a first number of bits in the sequence of bits, or amplitudes of a set of modulation symbols associated with the modulation scheme.

23. The wireless communication device of claim 21, wherein, to select the first composition from the subset of compositions, the at least one processor is configured to:

select the first composition based on a comparison of a modulation symbol distribution associated with the sequence of symbols to a modulation symbol distribution of the first composition.

24. The wireless communication device of claim 23, wherein the first composition corresponds to a first sub-interval of the plurality of sub-intervals, wherein first sub-interval is between a third value and a fourth value, and wherein, to decode the sequence of symbols, the at least one processor is configured to:

decode the sequence of symbols based on the first sub-interval between the third value and the fourth value.

25. The wireless communication device of claim 24, wherein the at least one processor is further configured to:

apply a scaling factor to the third value associated with the first composition to obtain a fifth value; and apply the scaling factor to the fourth value associated with the first composition to obtain a sixth value, wherein, to decode the sequence of symbols, the at least one processor is configured to:

decode the sequence of symbols based on an interval between the fifth value and the sixth value.

26. The wireless communication device of claim 25, wherein the scaling factor is based on a symbol distribution associated with the first composition.

* * * * *